US010580830B2

(12) United States Patent
Chang et al.

(10) Patent No.: US 10,580,830 B2
(45) Date of Patent: Mar. 3, 2020

(54) METHOD OF FABRICATING AN ELECTRICAL CIRCUIT ASSEMBLY ON A FLEXIBLE SUBSTRATE

(71) Applicant: NANYANG TECHNOLOGICAL UNIVERSITY, Singapore (SG)

(72) Inventors: Joseph Chang, Singapore (SG); Tong Ge, Singapore (SG); Tong Lin, Singapore (SG); Jia Zhou, Singapore (SG)

(73) Assignee: Nanyang Technological University, Singapore (SG)

(*) Notice: Subject to any disclaimer, the term of this patent is extended or adjusted under 35 U.S.C. 154(b) by 0 days.

(21) Appl. No.: 16/315,887

(22) PCT Filed: Jul. 7, 2017

(86) PCT No.: PCT/SG2017/050347
§ 371 (c)(1),
(2) Date: Jan. 7, 2019

(87) PCT Pub. No.: WO2018/009150
PCT Pub. Date: Jan. 11, 2018

(65) Prior Publication Data
US 2019/0305048 A1 Oct. 3, 2019

(30) Foreign Application Priority Data
Jul. 8, 2016 (SG) ............ 10201605592Q

(51) Int. Cl.
*H01L 27/28* (2006.01)
*H01L 51/00* (2006.01)
*H01L 51/05* (2006.01)

(52) U.S. Cl.
CPC .......... *H01L 27/281* (2013.01); *H01L 27/283* (2013.01); *H01L 51/0097* (2013.01); *H01L 51/0545* (2013.01); *H01L 51/0004* (2013.01)

(58) Field of Classification Search
CPC . H01L 27/281; H01L 27/283; H01L 51/0545; H01L 51/0097; H01L 51/0004
See application file for complete search history.

(56) References Cited

U.S. PATENT DOCUMENTS 3,723,635 A 3/1973 Smith
9,076,822 B2 7/2015 Loy et al.
(Continued)

FOREIGN PATENT DOCUMENTS

WO 2018009150 A1 1/2018

OTHER PUBLICATIONS

Foreign Communication from a Related Counterpart Application, International Search Report and Written Opinion dated Sep. 9, 2017, International Application No. PCT/SG2017/050347 filed on Jul. 7, 2017.
(Continued)

Primary Examiner — Karen Kusumakar

(57) ABSTRACT

A method of fabricating an electrical circuit assembly on a flexible substrate comprises: identifying one or more bending-sensitive elements of an electrical circuit assembly, each bending-sensitive element having a performance that varies when said bending-sensitive element is flexed; splitting said one or more bending-sensitive elements into a first portion and a second portion, wherein the first portion and the second portion are functionally equivalent and together equate to said bending-sensitive element; printing the first portion of said bending-sensitive element on a first surface of the flexible substrate; printing the second portion of said bending-sensitive element on a second surface of the flexible
(Continued)

substrate, diametrically opposite the first portion such that bending of the flexible substrate has an opposite effect on each of the first and second portions thereby serving to substantially cancel the effect on each portion out; and electrically connecting the first portion and the second portion.

17 Claims, 11 Drawing Sheets

(56) References Cited

U.S. PATENT DOCUMENTS

| | | | |
|---|---|---|---|
| 10,224,502 B2* | 3/2019 | Cho | G06F 1/1626 |
| 2008/0199597 A1* | 8/2008 | Huebler | H05K 1/16 427/97.1 |
| 2010/0002402 A1 | 1/2010 | Rogers et al. | |

OTHER PUBLICATIONS

Zhou J. et al., Printed Electronics: Effects of Bending and a Self-Compensation Means. IEEE Transactions on Circuits and Systems I: Regular Papers, Oct. 31, 2016, vol. 64, No. 3, pp. 505-515 [Retrieved on Sep. 7, 2017] DOI: 10.1109/TCSI.2016.2616907.

Chang J. et al., Fully Printed Electronics on Flexible Substrates: High Gain Amplifiers and DAC. Organic Electronics, Jan. 7, 2014, vol. 15, No. 3, pp. 701-710 [Retrieved on Sep. 7, 2017] DOI: 10.1016/J.ORGEL.2013.12.027.

Zhou J. et al., Fully Additive Low-Cost Printed Electronics With Very Low Process Variations. IEEE Transactions on Electron Devices, Dec. 29, 2015, vol. 63, No. 2, pp. 793-799 [Retrieved on Sep. 7, 2017] DOI:10.1109/TED.2015.2508484.

J. Chang, "Digital PE on Flex Sub: Challenges and Applications," Keynote Address, IEEE Async Circuits and Systems Conference, Germany, 2014.

X. Zhang, T. Ge, and J. Chang, "Fully-Additive PE: Transistor model, process variation and fundamental circuit designs," Organic Electronics, vol. 26, pp. 371-379, 2015.

O. E. Association, "OE-A Roadmap for Organic and Printed Electronics," White Paper 2014.

S. Abdinia et al., "A 4b ADC manufactured in a fully-printed organic complementary tech including resistors," ISSCC, 2013, pp. 106-107.

X. Wei et al., "A 3-V, 6-Bit C-2C DAC Using Complementary OTFTs," IEEE J. Solid-State Circuits, vol. 45, pp. 1380-1388, 2010.

C. Yang et al., "Bending-stress-driven phase transitions in pentacene thin films for flex OTFTs," Applied Physics Letters, vol. 92, p. 243305, 2008.

J. Pu et al., "Highly Flexible MoS2 Thin-Film Transistors with Ion Gel Dielectrics," Nano Letters, vol. 12, pp. 4013-4017, Aug. 8, 2012 2012.

K. Fukuda et al., "Strain sensitivity and durability in p-type and n-type OTFTs with printed silver electrodes," Sci. Rep., vol. 3, 2013.

L. Tong, C. Kwen-Siong, J. S. Chang, and G. Bah-Hwee, "An Ultra-Low Power Asyn-Logic In-Situ Self-Adaptive VDD Sys for Wireless Sensor Networks," IEEE J. Solid-State Circuits, vol. 48, pp. 573-586, 2013.

K. Chong, K.Chang, G. Bah-Hwee, and J. Chang, "Syn-Logic and GALS Acoustic DSP," IEEE J. Solid-State Circuits, vol. 47, pp. 769-780, 2012.

L. Wei-Hsiao et al., "Placement Optimization of Flexible TFT Digital Circuits," IMS3TW, 2011, pp. 149-152.

T. Sekitani, et al., "Ultraflexible OTFTs embedded at a neutral strain position," Applied Physics Letters, vol. 87, pp. 173502-173502-3, 2005.

DuPont Printed Electronic Materials. Available: www2.dupont.com/MC M/en_US/products/printed_electronics.html.

W. J. Hyun et al., "High-Resolution Patterning of Graphene by Screen Printing with a Silicon Stencil for Highly Flexible Printed Electronics," Advanced Materials, vol. 27, pp. 109-115, 2015.

P. H. Lau et al., "Fully Printed, High Performance Carbon Nanotube TFTs on Flexible Substrates," Nano Letters, vol. 13, pp. 3864-3869, 2013.

K.-J. Baeg et al., "Low-voltage, high speed inkjet-printed flexible complementary polymer electronic circuits," Organic Electronics, vol. 14, pp. 1407-1418, 2013.

M. Kaltenbrunner et al., "An ultra-lightweight design for imperceptible plastic electronics," Nature, vol. 499, pp. 458-463, 2013.

J. O'Doherty et al., "Active tactile exploration using a brain-machine-brain interface," Nature, vol. 479, pp. 228-231, 2011.

B. Tee et al., "A skin-inspired organic digital mechanoreceptor," Science, vol. 350, pp. 313-316, 2015.

C. Wang et al., "Extremely Bendable, High-Performance Integrated Circuits Using Semiconducting Carbon Nanotube Networks for Digital, Analog, and Radio-Frequency Applications," Nano Letters, vol. 12, pp. 1527-1533, 2012.

T. Sekitani et al., "Flexible organic transistors and circuits with extreme bending stability," Nature Materials, vol. 9, pp. 1015-1022, 2010.

Q. Cao et al., "Medium-scale carbon nanotube thin-film integrated circuits on flexible plastic substrates," Nature, vol. 454, pp. 495-500, 2008.

J. S. Chang and T. C. Tong, "A micropower-compatible time-multiplexed SC speech spectrum analyzer design," IEEE Journal of Solid-State Circuits, vol. 28, pp. 40-48, 1993.

* cited by examiner

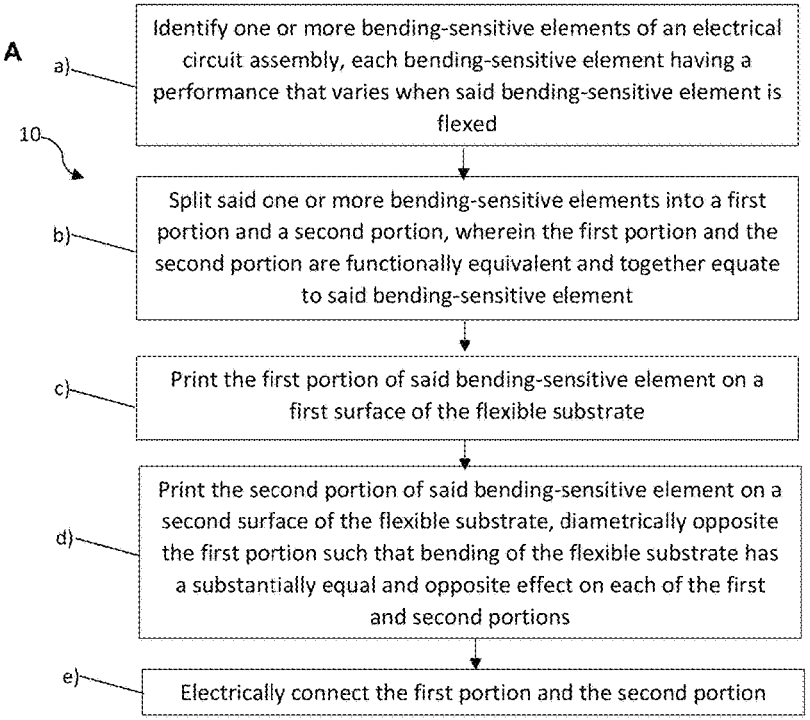

FIG. 1A a) Identify one or more bending-sensitive elements of an electrical circuit assembly, each bending-sensitive element having a performance that varies when said bending-sensitive element is flexed b) Split said one or more bending-sensitive elements into a first portion and a second portion, wherein the first portion and the second portion are functionally equivalent and together equate to said bending-sensitive element c) Print the first portion of said bending-sensitive element on a first surface of the flexible substrate d) Print the second portion of said bending-sensitive element on a second surface of the flexible substrate, diametrically opposite the first portion such that bending of the flexible substrate has a substantially equal and opposite effect on each of the first and second portions e) Electrically connect the first portion and the second portion

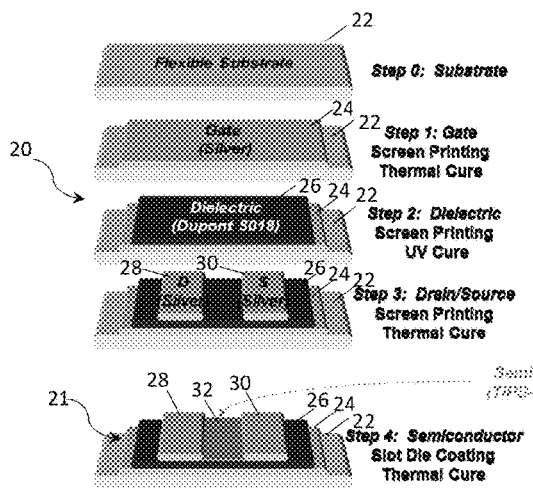

FIG. 1B

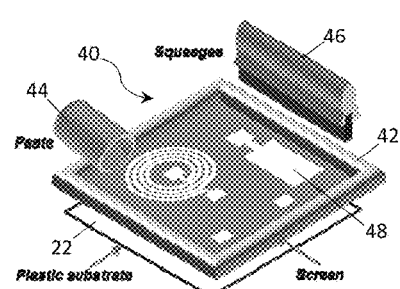

FIG. 1C

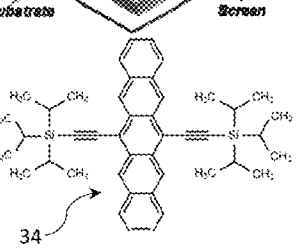

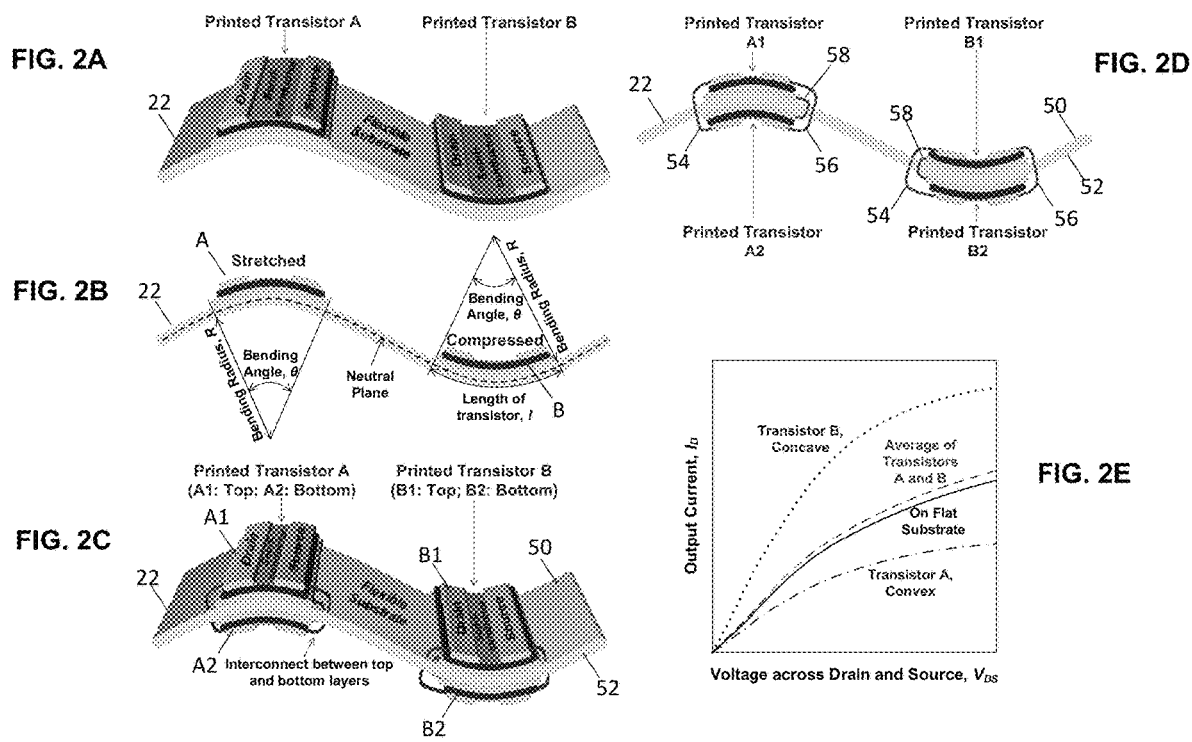

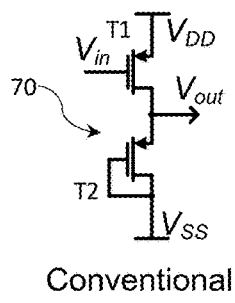
Conventional
FIG.5A
Proposed

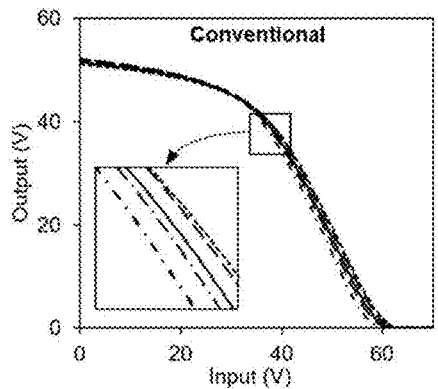
FIG.6A
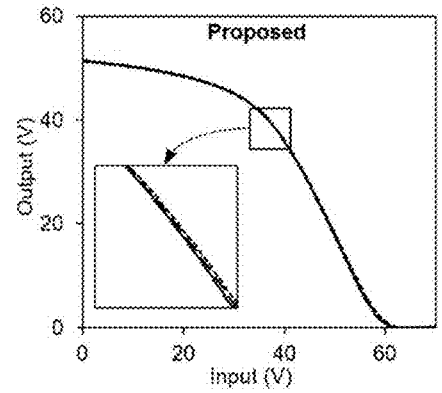
FIG.6B
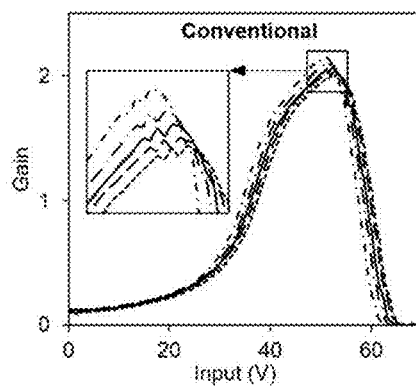
FIG.6C
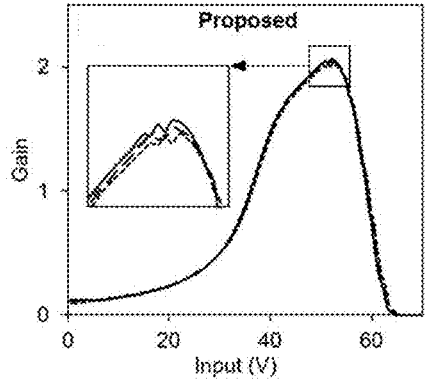
FIG.6D
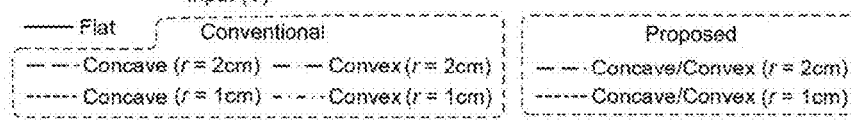
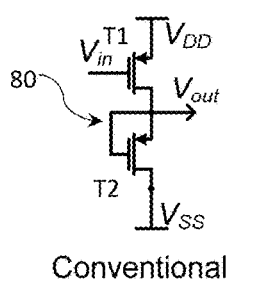
Conventional
FIG.7A
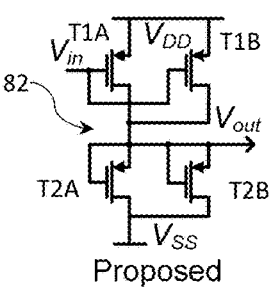
Proposed
FIG.7B
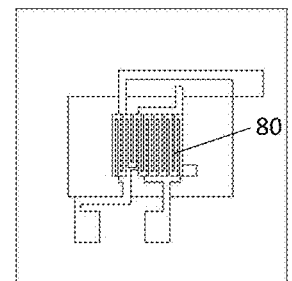
FIG.7C

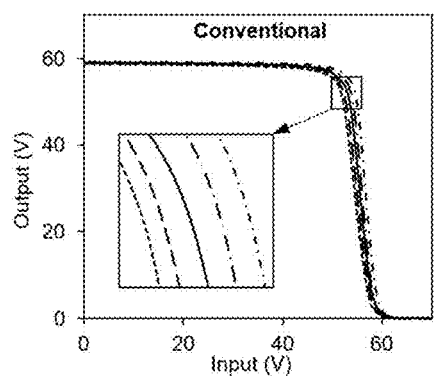
FIG. 8A
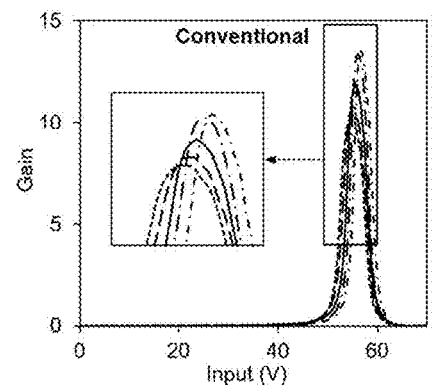
FIG. 8C
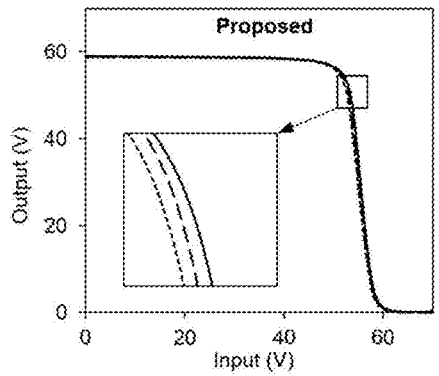
FIG. 8B
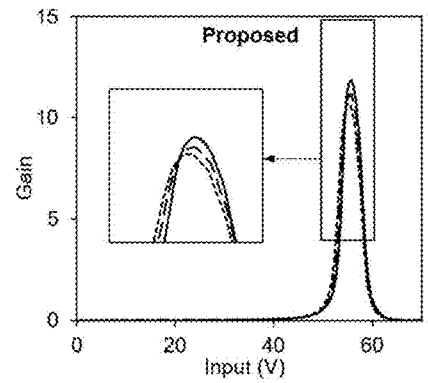
FIG. 8D
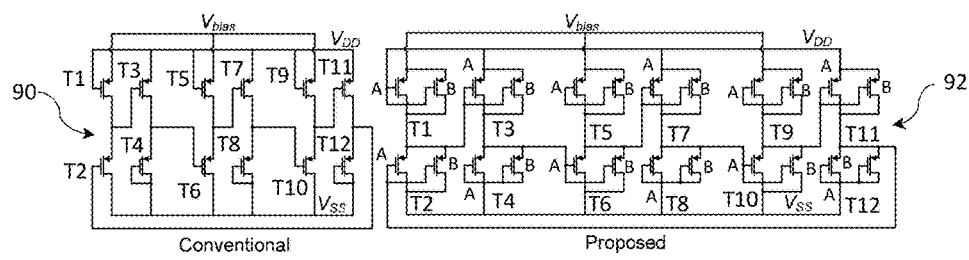
FIG. 9A
FIG. 9B

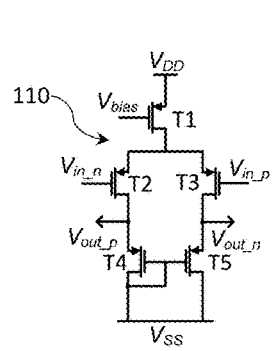
FIG.14A
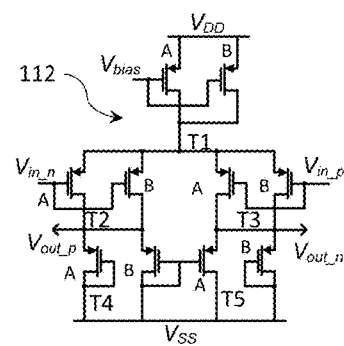
FIG.14B
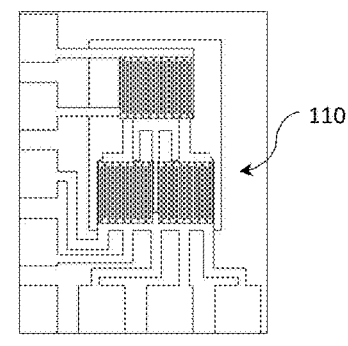
FIG.14C
FIG.15A
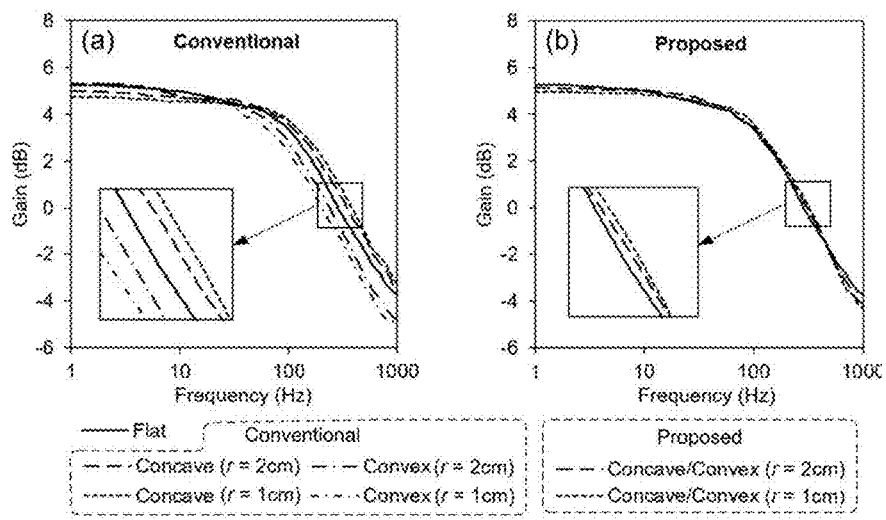
FIG.15B

METHOD OF FABRICATING AN ELECTRICAL CIRCUIT ASSEMBLY ON A FLEXIBLE SUBSTRATE

CROSS-REFERENCE TO RELATED APPLICATIONS

The present application is a filing under 35 U.S.C. 371 as the National Stage of International Application No. PCT/SG2017/050347, filed Jul. 7, 2017, entitled "A METHOD OF FABRICATING AN ELECTRICAL CIRCUIT ASSEMBLY ON A FLEXIBLE SUBSTRATE," which claims priority to Singapore Application No. SG 10201605592Q filed with the Intellectual Property Office of Singapore on Jul. 8, 2016, both of which are incorporated herein by reference in their entirety for all purposes.

FIELD OF THE INVENTION

The present invention relates to a method of fabricating an electrical circuit assembly on a flexible substrate.

BACKGROUND

Printed Electronics (PE) are highly desirable because they can be printed on-demand, anywhere and anytime; are scalable (e.g. into large formats like posters or wallpaper); and are inexpensive such that they can be used everywhere print media is used (i.e. with a unit cost of the order of cents such that they are considered to be disposable). Furthermore, one of the key technological advantages of Printed Electronics (PE) is its realization on flexible substrates (e.g. plastic) that can be moulded or bent in use or to be fitted into awkward or uneven spaces (see references 1-5 at the end of the specification).

Printed electronic printing technologies can, in general, be classified as either 'Subtractive' or 'Additive' processes. A Subtractive process involves a series of additive (deposition) steps followed by subtractive (etching, lift-off, etc.) steps (see references 6-7 at the end of the specification). In contrast, an Additive process involves deposition-only steps and it is therefore also known as a 'Fully-Additive' printing process.

Subtractive processes are dominant due to superior performance of the resulting devices when compared to those made using the Fully-Additive process. Accordingly, reported PE circuits and systems are generally realized using Subtractive processes (see references 1-4 at the end of the specification). However, disadvantages of the Subtractive process include the fact that it is not environmentally friendly (due to the use of corrosive chemicals); it is not on-demand (with attendant slow throughput and long processing times); and it is relatively expensive (requiring complex equipment and infrastructure and high wastage of chemicals, e.g. due to etching/lift-off procedures). These disadvantages contravene the desirable aims associated with printed electronics, as outlined above.

On the contrary, a Fully-Additive printing process is low cost, includes simple processing steps (i.e. no subtractive steps), can be performed on-demand (printing anywhere, anytime), with high throughput (quick printing) and scalability (large format printing).

However, irrespective of the printing process employed, one critical drawback with printed electronics is that the characteristics of printed electronic devices and sensors (including transistors, capacitors, resistors, etc.) vary significantly when the substrate is bent, resulting in intractable variations in the device performance and, in many cases, it is not possible to distinguish if the change is due to a sensed parameter or due to bending. In some cases, the bending (which may be convexly/outwardly or concavely/inwardly) may result in device, sensor, circuit or system failure (see references 8-9 at the end of the specification). Furthermore, in the context of synchronous-logic circuits, bending may lead to increased delays that may exceed a time constraint; leading to the need for asynchronous-logic circuits.

There are two reported methods (see references 13-14 at the end of the specification) to accommodate the change of the characteristics of electronic devices due to bending, and both methods have obvious drawbacks. In particular, in reference 13, the devices need to be located in an area where the bending is minimal. The major drawback of this method is the requirement of a priori information about the nature of the bending before the printed electronic devices are made and this information is generally unknown in advance of the manufacture and use of the device. In reference 14, another substrate layer is placed on top of the printed electronics such that the physical deformation of the printed electronics is reduced. However, this method undesirably doubles the overall thickness of the device and, in some sense, defeats the flexibility advantage of flexible substrates. In summary, these methods are mechanical solutions that may, at best, reduce the variation in the PE characteristics due to bending but will not eliminate it to a first order and therefore some ambiguity will remain. Accordingly, the above methods are largely insufficient and ineffective at addressing the problem associated with bending of printed electronic devices.

U.S. Pat. No. 3,723,635 discloses a method for forming double-sided flexible printed circuits wherein two sets of terminals are initially formed on the same side of a substrate, with each set being separated by a distance sufficient to allow the resulting substrate region there-between to be bent around and secured to a rigid support member. The two sets of terminals are therefore ultimately positioned on opposite sides of the support member. However, the presence of the rigid support member means that the resulting product is not flexible, at least in the region of the support member, even though the initial substrate is flexible.

U.S. Pat. No. 9,076,822 discloses a generally rigid carrier substrate—on a first side of which is mounted a first flexible substrate and on a second side of which is mounted a second flexible substrate. A first electronic device is deposited on the first flexible substrate and a second electronic device is deposited on the second flexible substrate. However, as above, the presence of the rigid carrier substrate means that the resulting product is not flexible, at least in the region of the carrier substrate, even though the first and second substrates are flexible.

It is therefore an aim of the present invention to provide an improved method of fabricating an electrical circuit assembly on a flexible substrate that helps to ameliorate one or more of the above problems.

SUMMARY OF THE INVENTION

In accordance with a first aspect of the invention there is provided a method of fabricating an electrical circuit assembly on a flexible substrate comprising:
  a) identifying one or more bending-sensitive elements of an electrical circuit assembly, each bending-sensitive element having a performance that varies when said bending-sensitive element is flexed;
  b) splitting said one or more bending-sensitive elements into a first portion and a second portion, wherein the first portion and the second portion are functionally equivalent and together equate to said bending-sensitive element;

c) printing the first portion of said bending-sensitive element on a first surface of the flexible substrate;

d) printing the second portion of said bending-sensitive element on a second surface of the flexible substrate, diametrically opposite the first portion such that bending of the flexible substrate has an opposite effect on each of the first and second portions thereby serving to substantially cancel the effect on each portion out; and e) electrically connecting the first portion and the second portion.

Thus, embodiments of present invention provide a method of fabricating an electrical circuit assembly on a flexible substrate which is able to self-compensate for the effect of any bending on its electrical performance. More specifically, it will be understood that bending resulting in compression (i.e. concave or inward bending) of one of the first or second portions will in turn result in extension (i.e. convex or outward bending) of the other of the first or second portions thereby providing an equal and opposite electrical effect such that the bending effects on each of the first and second portions will effectively cancel each other out resulting in little or no residual bending effect. It will also be understood that the proposed method of self-compensation is a localised effect and constitutes an electrical solution (as opposed to a mechanical solution) to some of the problems associated with printed electronics on a flexible substrate.

In general terms, embodiments of the invention provide a localised self-compensation effect that innately self-compensates for changing characteristics of printed electronics on a flexible substrate due to bending of the substrate. Advantages of the proposed method over the state-of-the-art include: (i) localised self-compensation; (ii) no/little hardware overhead (i.e. no increased complexity); (iii) no power dissipation overhead; (iv) little, if any, substrate area overhead; (v) non-mechanical means (i.e. the thickness of the flexible substrate remains substantially unchanged); (vi) no reduction or restriction to the flexibility of the substrate; and (vii) no a priori information for the placement of the electronics is needed.

Embodiments of the invention are highly efficacious and experiments have shown that variations in the electrical characteristics due to bending can be reduced by between approximately 2 times and greater than 100 times.

The splitting of the bending-sensitive elements into a first portion and a second portion may be considered as partitioning the bending-sensitive elements into two constituent parts. Thus, the first portion and the second portion may effectively constitute two halves of the same bending-sensitive element.

It should be noted that it is not necessary for all of the components of the electrical circuit assembly to be separated into two portions. Instead, only the bending-sensitive elements, whose characteristics vary when the substrate is bent, need to be separated and printed on opposite sides of the substrate. Any elements that are not bending-sensitive can remain as single unchanged elements on only one side of the substrate. For instance, in some (but not all) printed electronic processes, the characteristics of passive components such as resistors, capacitors and inductors remain unchanged even when the substrate is bent. In this case, these components can remain as one part, instead of separating them into two halves.

The first and second portions may have identical configurations or different configurations as long as they are functionally equivalent such that the effect of bending on each portion is substantially equal and opposite in value.

The first and second portions have one or more of: a same value, a same dimension, a same area, a same volume, a same footprint or a same aspect ratio.

In embodiments of the invention, the printing of the first and/or second portions may be by a Fully-Additive process. Thus, embodiments of the invention may also benefit from the advantages associated with Fully-Additive printed electronics such as the simplicity of the process.

The Fully-Additive process may be constituted by an all-air process (i.e. printing in air without special gases such as those commonly used in nitrogen chambers).

The Fully-Additive process may be constituted by a low temperature process (typically <120° C. since many inexpensive substrates such as polyethylene terephthalate (PET) plastic films deform in temperatures beyond ~120° C.).

Embodiments of the invention may comprise the following steps for the printing of each of the first and second portions of the electrical circuit assembly, when the electrical circuit assembly comprises an organic thin film transistor (OTFT):

a) screen printing and curing a gate on the flexible substrate;

b) screen printing and curing a dielectric on the gate;

c) screen printing and curing a drain and a source spatially-separated on the dielectric; and d) slot die coating a semiconductor layer between the drain and source.

Each curing step may comprise one or more of: thermal curing or ultraviolet (UV) curing.

The semiconductor may comprise 6,13-Bis (triisopropylsilylethynyl) pentacene also known as TIPS-Pentacene.

The gate, drain and source may each comprise silver and the dielectric may comprise Dupont 5018™.

In accordance with a second aspect of the invention there is provided an electrical circuit assembly comprising:

a flexible substrate;

a first portion of a bending-sensitive element of the electrical circuit assembly printed on a first surface of the flexible substrate;

a second portion of the bending-sensitive element of the electrical circuit assembly printed on a second surface of the flexible substrate;

wherein the first and second portions are electrically connected to each other and are functionally equivalent; and wherein the first portion and the second portion are located diametrically opposite each other such that bending of the flexible substrate has an opposite effect on each of the first and second portions thereby serving to substantially cancel the effect on each portion out.

Thus, embodiments of the second aspect of the invention provide an electrical circuit assembly capable of self-compensation of electrical effects resulting from bending of the flexible substrate on which the assembly is provided.

The electrical circuit assembly may comprise one or more individual elements, components or circuits. For example, the electrical circuit assembly may comprise one or more of the following: transistor, Organic Thin Film Transistor (OTFT), resistor, capacitor, inductor, inverter, diode-connected inverter, zero-gate-source-voltage (zero-$V_{GS}$) inverter, ring-oscillator, diode-connected ring-oscillator, zero-gate-source-voltage (zero-$V_{GS}$) ring-oscillator, multi-layer interconnect, data converter, digital-to-analogue converter (DAC), operational amplifier (op-amp), differential amplifier, capacitor-based circuit, diode-connected circuit or sensor.

The electrical circuit assembly may be configured for analogue, digital or mixed signal processing.

The electrical circuit assembly may comprise one or more active and/or passive elements.

The first and second portions may be electrically connected through one or more vias.

In accordance with a third aspect of the invention there is provided a device comprising the electrical circuit assembly as described above.

The device may be configured as an electronic skin (i.e. e-skin). Accordingly, the device may comprise one or more sensors (e.g. tactile sensors) on the flexible substrate for sensing pressure and/or bending and the electrical circuit assembly for signal conditioning or processing (e.g. to convert a sensed analogue parameter into a digital signal that mimics a physiological stimulation).

In some embodiments, the device may be configured as a neuroprosthetic. In which case, the sensor and signal conditioning electrical circuit assembly may be printed in close proximity (e.g. the sensor may be provided above the signal conditioning electrical circuit assembly).

BRIEF DESCRIPTION OF THE DRAWINGS

Embodiments of the invention will now be described, by way of example only, with reference to the following drawings, in which:

FIG. 1(a) outlines a method of fabricating an electrical circuit assembly on a flexible substrate according to an embodiment of the invention;

FIG. 1(b) illustrates a Fully-Additive printing process for a first portion of a transistor element in accordance with an embodiment of the invention;

FIG. 1(c) illustrates a screen printing process in accordance with an embodiment of the invention;

FIG. 2(a) illustrates a perspective view of flexing of a flexible substrate comprising two transistor elements A and B printed on a same side of the flexible substrate in accordance with a conventional design;

FIG. 2(b) illustrates a cross-sectional view showing in more detail the nature of the respective stretching and compression of the two transistor elements A and B of FIG. 2(a);

FIG. 2(c) shows a view similar to that of FIG. 2(a) but wherein the two transistor elements A and B are split into a top A1, B1 and a bottom A2, B2 portion in accordance with an embodiment of the invention;

FIG. 2(d) shows a view similar to that of FIG. 2(b) but wherein the two transistor elements A and B are split into a top A1, B1 and a bottom A2, B2 portion in accordance with an embodiment of the invention;

FIG. 2(e) shows a graph of output drain current $I_D$ against voltage across drain and source $V_{DS}$ for the two transistors A and B;

FIG. 5(a) shows a circuit diagram for a conventional diode-connector inverter;

FIG. 6(a) shows a graph of output voltage against input voltage for the conventional diode-connector inverter of FIG. 5(a);

FIG. 6(b) shows a graph of inverter gain against input voltage for the conventional diode-connector inverter of FIG. 5(a);

FIG. 6(c) shows a graph of output voltage against input voltage for the proposed split diode-connector inverter of FIG. 5(b);

FIG. 6(d) shows a graph of inverter gain against input voltage for the proposed split diode-connector inverter of FIG. 5(b);

FIG. 7(a) shows a circuit diagram for a conventional zero-$V_{GS}$ connected inverter;

FIG. 7(b) shows a circuit diagram for a proposed split zero-$V_{GS}$ connected inverter;

FIG. 7(c) shows a micrograph of the proposed split zero-$V_{GS}$ connected inverter of FIG. 7(b);

FIG. 8(a) shows a graph of output voltage against input voltage for the conventional zero-$V_{GS}$ connected inverter of FIG. 7(a);

FIG. 8(b) shows a graph of inverter gain against input voltage for the conventional zero-$V_{GS}$ connected inverter of FIG. 7(a);

FIG. 8(c) shows a graph of output voltage against input voltage for the proposed split zero-$V_{GS}$ connected inverter of FIG. 7(b);

FIG. 8(d) shows a graph of inverter gain against input voltage for the proposed split zero-$V_{GS}$ connected inverter of FIG. 7(b);

FIG. 9(a) shows a circuit diagram for a conventional diode-connected ring-oscillator with level shifter;

FIG. 9(b) shows a circuit diagram for a proposed split diode-connected ring-oscillator with level shifter;

FIG. 10(a) shows a micrograph of a top side of the proposed split diode-connected ring-oscillator of FIG. 9(b);

FIG. 10(b) shows a micrograph of a bottom side of the proposed split diode-connected ring-oscillator of FIG. 9(b);

FIG. 10(c) shows a photograph of the proposed split diode-connected ring-oscillator of FIGS. 10(a) and 10(b);

FIG. 14(a) shows a circuit diagram for a conventional operational-amplifier;

FIG. 14(b) shows a circuit diagram for a proposed split operational-amplifier;

FIG. 14(c) shows a micrograph of the proposed split operational-amplifier of FIG. 14(b);

FIG. 15(a) shows a graph of gain (dB) against frequency (Hz) for the conventional operational-amplifier of FIG. 14(a);

FIG. 15(b) shows a graph of gain (dB) against frequency (Hz) for the proposed split operational-amplifier of FIG. 14(b);

DETAILED DESCRIPTION

Figure 3A:
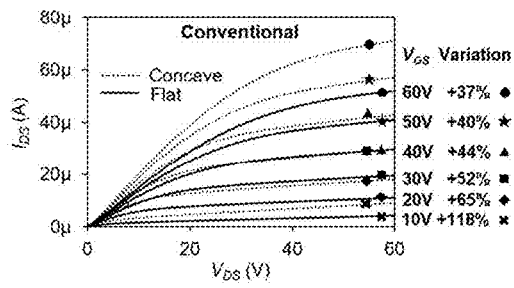
FIG. 3(a) shows a graph of output drain current I (A) against voltage across gain and source $V_{gs}$ (V) for the conventional transistor A when both concave and flat.

In accordance with a first embodiment of the present invention there is provided a method 10 of fabricating an electrical circuit assembly on a flexible substrate, as illustrated in FIG. 1. The method 10 comprises the following steps:

a) identifying one or more bending-sensitive elements of an electrical circuit assembly, each bending-sensitive element having a performance that varies when said bending-sensitive element is flexed;

b) splitting said one or more bending-sensitive elements into a first portion and a second portion, wherein the first portion and the second portion are functionally equivalent and together equate to said bending-sensitive element;

c) printing the first portion of said bending-sensitive element on a first surface of the flexible substrate;

d) printing the second portion of said bending-sensitive element on a second surface of the flexible substrate, diametrically opposite the first portion such that bending of the flexible substrate has an opposite effect on each of the first and second portions thereby serving to substantially cancel the effect on each portion out; and e) electrically connecting the first portion and the second portion.

Thus, embodiments of the invention provide a method 10 for printing electronics on a flexible substrate such that bending of the substrate has little or no residual effect on the performance of the electronics.

In one embodiment, the method 10 is performed using a Fully-Additive screen printing process 20 as illustrated in FIG. 1(b) for a first organic thin-film transistor (OTFT) 21 printed on a first side of a plastic flexible substrate 22. It will be understood that in other embodiments the electrical circuit assembly may take another form and may comprise one or more electrical circuits or electrical components. It should also be noted that the figures are not drawn to scale and the thickness of the OTFT 21 is exaggerated (in reality, the OTFT 21 is significantly thinner than the substrate 22). As will be explained below, the OTFT 21 is a bending-sensitive element.

In an initial step 0, the flexible substrate 22 is provided. In a step 1, a silver gate layer 24 is screen printed on the flexible substrate 22 and is heat-cured in an oven (not shown). In a step 2, a dielectric layer 26 made of Dupont 5018™ is screen printed on the gate layer 24 and cured using ultraviolet (UV) light. In a step 3, a silver drain 28 and a silver source 30 are screen printed on the dielectric layer 26 and heat-cured in the oven. In a step 4, a semiconductor layer 32 made of 6,13-Bis(triisopropylsilylethynyl)pentacene (also known as TIPS-Pentacene) is slot-die coated and heat-cured on a hotplate. For reference, a molecular structure 34 of TIPS-Pentacene is also illustrated in FIG. 1(b).

The Fully-Additive screen printing process 20 can be carried out as an all-air process (i.e. printing in air without special gases such as those commonly used in nitrogen chambers). In addition, the Fully-Additive screen printing process 20 can be a low temperature process (typically <120° C. since many inexpensive substrates such as polyethylene terephthalate (PET) plastic films deform in temperatures beyond ~120° C.).

Further details of which may be incorporated into the low-cost Fully-Additive screen printing process 20 described above, can be found in references 1-4 listed at the end of the specification.

The simplicity of the Fully-Additive screen printing process 20 makes it easy to print electronic components, elements or circuits on both sides of the flexible substrate 22. Accordingly, although only one OTFT 21 is illustrated in FIG. 1(b) it will be understood that the same Fully-Additive screen printing process 20 may be employed to print a second OTFT 21 on a second side of the flexible substrate 22 in accordance with embodiments of the invention.

Furthermore, variations between the OTFTs 21 may be minimised by precise control of the semiconductor layer 32, for example, by blade coating the semiconductor layer 32 using a polymer small molecular blend in a dual-solvent system. The resulting process variations are a low at approximately ±4.9% carrier mobility ($\mu$) and ±0.43V threshold voltage ($V_{th}$).

The OTFTs 21 described above have been demonstrated to feature the highest carrier mobility of all reported Fully-Additive OTFTs, at 1.5 cm$^2$/Vs. However, the Fully-Additive screen printing process 20 may also be employed to print other electronic components according to embodiments of the invention, including complex circuits (e.g. amplifiers and digital-to-analogue converters DACS) and passive devices including capacitors, resistors and inductors. In some embodiments, resistors have been printed with resistance ranges from <10Ω/□ to 800 kΩ/□ (depending on the composition/blending of the ink), capacitors have been printed with capacitance ranges from ~2 pF to 570 pF and physical size ranging from 0.01 cm$^2$ to 2.56 cm$^2$, while inductors have been printed with inductance ranges from 1 pH to 8 pH (depending on the size of the printed inductors and the operating frequency), with quality factor (Q) >10 at 10 MHz. Further details of such embodiments are described in more detail below.

For completeness, FIG. 1(c) illustrates a screen printing apparatus 40 employed in the screen printing process 20 of FIG. 1(b). Thus, the apparatus comprises a screen 42 located above the flexible plastic substrate 22; a container 44 of paste (i.e. molten material) which is flowed over the screen 42 to form each desired layer or element; and a squeegee 46 which is wiped over the screen 42 to compress the paste into formations 48 provided on the screen 42 to form the desired shape of the layer/element.

Regardless of which printing technique is used, one common drawback of traditional (single-sided) printed electronics on a flexible substrate is that the characteristics of the printed electronics (e.g. transistors, capacitors, resistors, etc.) change when the substrate is bent (i.e. the element is bending-sensitive). FIGS. 2(a) and 2(b) illustrate two printed transistors A and B (each one similar to one of the OTFTs 21 described above) spaced apart on the same side of the flexible substrate 22. As depicted in FIGS. 2(a) and 2(b), the substrate 22 is bent convexly in the region of transistor A and the substrate 22 is bent concavely in the region of transistor B. As illustrated in FIG. 2(b), transistor A is stretched due to convex bending and transistor B is compressed due to concave bending. In each case, the amount of bending or change in the length I of each transistor A or B can be quantified in terms of a bending radius R extending from each end of each transistor A or B to a point where they cross and a bending angle θ there-between. As the substrate 22 is, in practice, significantly thicker and stiffer than the transistors A and B, the centre of the substrate 22—between transistors A and B—can be assumed to form a neutral plane (e.g. where no physical deformation or bending is experienced). As explained previously, the bending of the substrate 22 results in a change of the physical dimensions of the printed electronics (in this case, transistors A and B), and hence results in a change of their electrical characteristics.

The applicants have observed through experiments conducted on numerous printed electrical circuit assemblies (such as the transistors A and B) that the changes in the electrical characteristics due to concave bending and due to convex bending are usually opposite or converse. For example, for the transistors A and B, the drain current increases when the transistor B is bent concavely and the drain current decreases when the transistor A is bent convexly. Furthermore, the amount of change of the drain current is largely determined by the bending radius, R. In other words, if the bending angle θ of two equally sized transistors A and B is the same, but one is bent concavely and the other is bent convexly, the amount of change in their respective drain current is approximately the same but with opposite signs and the average of their respective drain current is approximately the same as that when both transistors A and B experience no bending (i.e. when the substrate 22 is flat).

The above observations are evident from the graph of FIG. 2(e) which shows output drain current $I_D$ against voltage across drain and source $V_{DS}$ for convex transistor A and concave transistor B. The drain current for transistor A is decreased and the drain current for transistor B is increased when compared to the drain current for each transistor A/B when they are flat. In addition, the average value of the drain current for transistors A and B is close to the drain current for each transistor A/B when they are flat. Thus, proving that the effect of bending by the same amount is approximately equal and opposite in sign depending on whether the bending is concave or convex.

In light of the above, the applicants have proposed the use of a localised self-compensation effect in embodiments of the present invention. In particular, the bending-sensitive elements of a desired electrical circuit assembly are split or partitioned into two identical parts or halves, and each part is respectively printed on opposite top and bottom sides of a flexible substrate and is electrically connected to its sister-part through vias. A perspective view and cross-sectional view of two printed transistors similar to those shown in FIGS. 2(a) and 2(b) but based on the proposed method are depicted in FIGS. 2(c) and 2(d) respectively. As such FIGS. 2(c) and 2(d) show two electrical circuit assemblies in the form of transistors A and B comprising: a flexible substrate 22; a first portion A1/B1 printed on a first (top) surface 50 of the flexible substrate 22; a second portion A2/B2 printed on a second (bottom) surface 52 of the flexible substrate 22; wherein the first and second portions A1/B1 and A2/B2 are substantially identical and together equate to a desired electrical circuit assembly A/B; and wherein the first portion and the second portion A1/B1 and A2/B2 are located diametrically opposite each other and are electrically connected to each other. In this case, the electrical connections are through a first via 54 connecting each drain part, a second via 56 connecting each source part and a third via 58 connecting each gate part of each of the transistors A1/A2 and B1/B2. In other embodiments other types of electrical connections may be employed.

When the substrate 22 is bent, the transistors A1/B1 on the top surface 50 and on the bottom surface 52 will experience largely equal but opposite stresses. Specifically, when the substrate 22 is bent convexly, the part on the top surface A1 will be stretched and the part on the bottom surface A2 will be compressed. Similarly, when the substrate 22 is bent concavely, part on the top surface B1 will be compressed and part on the bottom surface B2 will be stretched. Consequently, because of the opposing effects experienced by each of each part of each transistor A and B, the total drain current of A1 and A2 (or B1 and B2) when bent will be approximately the same as A1 and A2 (or B1 and B2) when unbent (i.e. when flat). Accordingly, embodiments of the invention provide a method and electrical circuit assembly configured to cancel the effects of bending when printed on flexible substrates.

Experimental Results—Transistors

FIGS. 3(a) to (e) depict the output characteristics of printed transistors (i.e. OTFTs 21) based on both the conventional design shown in FIGS. 2(a) and 2(b) and on the proposed design shown in FIGS. 2(c) and 2(d). Note that for the conventional design, the two printed transistors A and B are printed on the same side of the flexible substrate 22 whilst in the proposed design, each transistor A/B is split into two halves A1/A2 and B1/B2 which are printed respectively on the top surface A1/B1 and bottom surface A2/B2 of the flexible substrate 22. In this experiment, the characteristics of each transistor were measured using a Keithley 4200-SCS Parameter Analyzer and a bending radius R of 1 cm was tested.

FIG. 3(a) shows a graph of output drain current I (A) against voltage across gain and source $V_{gs}$ (V) for the conventional transistor B when both concave and flat, for a range of bias conditions (i.e. $V_{GS}$=10V, 20V, 30V, 40V, 50V, 60V). In each case, a percentage variation between the measurements for the flat and the concave scenarios was calculated as follows: +118% at $V_{GS}$=10V, +65% at $V_{GS}$=20V, +52% at $V_{GS}$=30V, +44% at $V_{GS}$=40V, +40% at $V_{GS}$=50V and +37% at $V_{GS}$=60V. Notably, when the transistor B is bent concavely, its current is increased and has a positive variation.

Figure 3B:
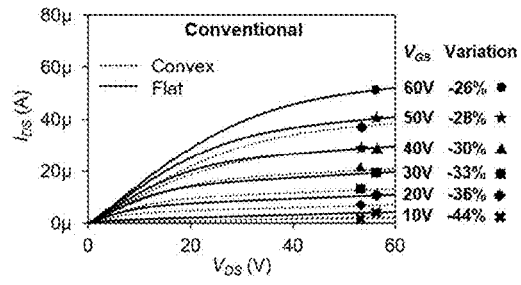
FIG. 3(b) shows a graph of output drain current I (A) against voltage across gain and source $V_{gs}$ (V) for the conventional transistor A when both convex and flat.

FIG. 3(b) shows a graph of output drain current I (A) against voltage across gain and source $V_{gs}$ (V) for the conventional transistor A when both convex and flat for a range of bias conditions (i.e. $V_{GS}$=10V, 20V, 30V, 40V, 50V, 60V). In each case, a percentage variation between the measurements for the flat and the convex scenarios was calculated as follows: −44% at $V_{GS}$=10V, −36% at $V_{GS}$=20V, −33% at $V_{GS}$=30V, −30% at $V_{GS}$=40V, −28% at $V_{GS}$=50V and −26% at $V_{GS}$=60V. Notably, when the transistor A is bent convexly, its current is decreased and has a negative variation.

Compared to the case when the conventional transistor A/B is flat, the current variation due to bending is large. For example, at a bias condition of $V_{GS}$=60, the current is varied by 63% overall at bending radius of 1 cm—respectively +37% and −26% when the transistor is bent concavely and convexly. Such a large variation is problematic, particular for sensing applications since it unclear whether any variation is due to a change in the sensed parameter or due to bending. In fact, this problem is exacerbated because the magnitude of the variation changes not only for different bias conditions (as shown in FIGS. 3(a) and 3(b)) but also for different bending radii (as will be described below in relation to FIG. 3(f)).

Figure 3C:
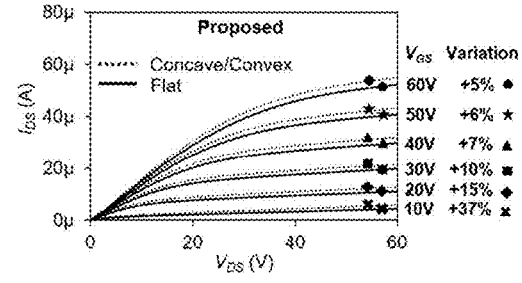
FIG. 3(c) shows a graph of output drain current I (A) against voltage across gain and source $V_{gs}$ (V) for the proposed split transistor A1, A2 when both bent and flat.

FIG. 3(c) shows a graph of output drain current I (A) against voltage across gain and source $V_{gs}$ (V) for the proposed split transistor A1/A2 when both bent (one part concave and the opposite part convex) and flat for a range of bias conditions (i.e. $V_{GS}$=10V, 20V, 30V, 40V, 50V, 60V). In each case, a percentage variation between the measurements for the flat and the bent scenarios was calculated as follows: +37% at $V_{GS}$=10V, +15% at $V_{GS}$=20V, +10% at $V_{GS}$=30V, +7% at $V_{GS}$=40V, +6% at $V_{GS}$=50V and +5% at $V_{GS}$=60V. Notably, when the proposed transistor is bent, the variation in current due to bending is significantly reduced when compared with the conventional transistors of FIGS. 3(a) and 3(b). For example, at the same bias condition of $V_{GS}$=60, the current variation is reduced from 63% to a mere 5% which represents more than a 12 times reduction in the current variation. Also, it is noted that the variation is reduced as the bias current is increased. Furthermore, a 5% variation from bending is approximately equal to the variations that may arise from the printing process itself and, in any case, in the context of circuit design, a 5% variation can be easily accommodated.

Figure 3D:
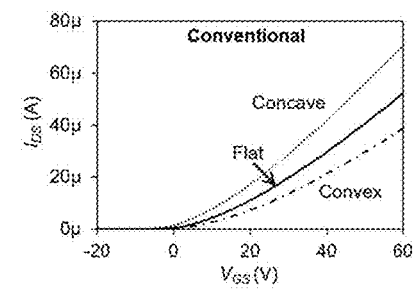
FIG. 3(d) shows a graph of output drain current I (A) against voltage across gain and source $V_{gs}$ (V) for the conventional transistor A when flat, concave and convex.
Figure 3E:
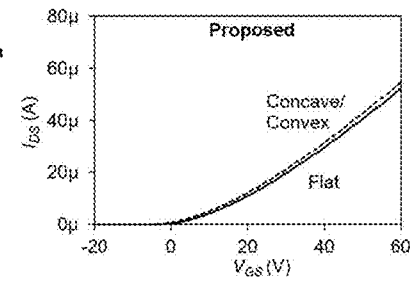
FIG. 3(e) shows a graph of output drain current I (A) against voltage across gain and source $V_{gs}$ (V) for the proposed split transistor A1, A2 when both bent and flat.

FIG. 3(d) shows a graph of output drain current I (A) against input voltage across gain and source $V_{gs}$ (V) for the conventional transistor A/B when flat, concave and convex and FIG. 3(e) shows a graph of output drain current I (A) against input voltage across gain and source $V_{gs}$ (V) for the proposed split transistor A1, A2 when both bent and flat. Accordingly, it can be seen that the proposed design of FIG. 3(e) has little variation of input-output transfer characteristics when bent and when flat compared to the large variation shown for the concave and convex conventional transistor of FIG. 3(d).

Figure 3F:
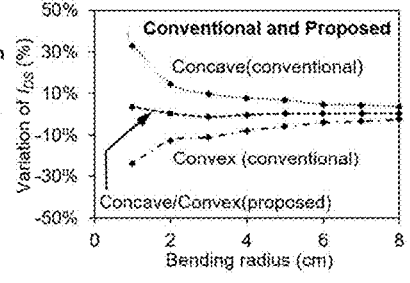
FIG. 3(f) shows a graph of normalised drain current I (%) against bending radius (cm) for the proposed split transistor A1, A2 and the conventional transistor A when both concave and convex bending is applied.

FIG. 3(f) shows a graph of normalised drain current I (%) (with respect to the current when the transistor is flat) against bending radius (from 1 cm to 8 cm) for the proposed split transistor A1, A2 and the conventional transistor A when both concave and convex bending is applied. It can therefore be observed that greater variation results when the bending radius is small (i.e. the bending angle is large) and less variation results when the bending radius is large (i.e. the bending angle is small), particularly for the conventional transistor. Thus, as expected, the current variation due to bending reduces when the bending radius increases. However, the variation is significantly reduced for all bending radii in respect of the proposed transistor. Specifically, the reduction is from about one order to two orders of magnitude (12×, 26×, 34×, 99×, 19×, 14×, 10× and 8× for a bending radius of 1, to 8 cm respectively). In addition, as observed earlier, in general, the variations of a conventional transistor bent concavely and convexly are largely the same (or similar value) but of opposite directions (signs). The worst case variations occur for the smallest bending radius, R=1 cm.

In light of the above, it has been demonstrated that electrical circuit assemblies in the form of transistors can be fabricated in accordance with embodiments of the invention in order to largely negate the effect of bending on the transistor performance.

Experimental Results—Capacitors

Figure 4A:
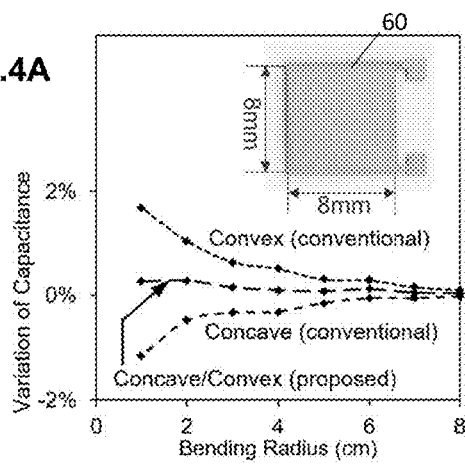
FIG. 4(a) shows a graph of normalised capacitance against bending radius (cm) for a proposed split capacitor and a conventional capacitor when both concave and convex bending is applied.

In a similar manner to the above transistors, a proposed capacitor 60 was printed on a flexible substrate in accordance with an embodiment of the invention. As such the capacitor 60 was split into two identical portions and a first portion was printed on the first surface of the substrate and a second portion was printed on a second surface of the substrate. Each portion was printed using the Fully-Additive process outlined above. The two portions were connected to each other through vias and a top portion of FIG. 4(a) shows a micrograph of the printed capacitor 60 from above. Each portion of the printed capacitor 60 has an area of 64 mm$^2$ with nominal (when the capacitor is flat) capacitance of 91.8 pF.

For comparison purposes, a conventional capacitor was also printed on a single side of a flexible substrate (not shown).

The bottom of FIG. 4(a) depicts the normalized capacitance of the proposed capacitor 60 and conventional capacitor (with respect to the capacitance when the capacitors are flat) at various bending radii. Converse to the transistors, it can be seen that when the conventional capacitor is bent convexly, its capacitance increases and vice versa. This is believed to be because when the capacitor is bent convexly, the area of the capacitor increases and vice versa. As expected, the capacitance variation increases as the bending radius reduces. Compared to the conventional capacitor when either convexly or concavely bent, the proposed capacitor 60 based on an embodiment of the invention features significantly less variation. Specifically, at a bending radius of 1 cm, the capacitance varies only 0.27% if the proposed method is used, while it varies approximately 2.9% (1.7% increase when bent convexly and 1.2% decrease when bent concavely) if the conventional design is used. Compared to the convention design, the proposed method provides capacitance variation reductions of 11×, 5×, 6×, 8×, 6×, 3×, 4× and 3× at bending radii of 1 cm to 8 cm respectively.

Experimental Results—Resistors

Figure 4B:
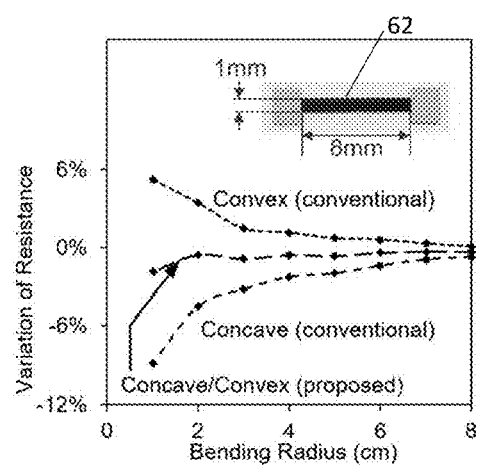
FIG. 4(b) shows a graph of normalised resistance against bending radius (cm) for a proposed split resistor and a conventional resistor when both concave and convex bending is applied.

In a similar manner to the above transistors and capacitors, a proposed resistor 62 was printed on a flexible substrate in accordance with an embodiment of the invention. As such the resistor 62 was split into two identical portions and a first portion was printed on the first surface of the substrate and a second portion was printed on a second surface of the substrate. Each portion was printed using the Fully-Additive process outlined above. The two portions were connected to each other through vias and a top portion of FIG. 4(b) shows a micrograph of the printed resistor 62 from above. Each portion of the printed resistor 62 had a dimension of 8 cm (length) by 1 cm (width) and a measured resistance of 26.4 kΩ.

For comparison purposes, a conventional resistor was also printed on a single side of a flexible substrate (not shown).

The bottom of FIG. 4(b) depicts the normalized resistance of the proposed resistor 62 and conventional resistor (with respect to the resistance when the resistors are flat) at various bending radii. Accordingly, and similarly to the above capacitors, the bending properties depicted in FIG. 4(b) show that the resistance decreases when the conventional resistor is bent concavely and vice versa. Furthermore, the sensitivity of the conventional resistor to bending is substantially higher (~5×) when compared to that of the printed capacitor (e.g., for r=1 cm, 14% vs 3%). This is believed to be because of the intrinsic property differences for the different materials used for the resistors and capacitors. However, in a similar manner to the case of printed transistors and printed capacitors, the resistance variation can be significantly reduced by the proposed method resulting in an 8×, 15×, 6×, 6×, 4×, 5×, 4× and 3× reduction in resistance variation for bending radii of 1 cm to 8 cm respectively. More specifically, for a bending radius of 1 cm, an overall 14% variation (convex+concave) of the conventional resistor is significantly reduced by nearly an order of magnitude (~8×) to a small 1.8%. Also, as expected, the resistance variations increase as the bending radius reduces.

Bending of Printed Circuits

In summary, the above experimental results show that the proposed self-compensation method of embodiments of the invention provides a significant reduction in parameter variation for both printed active (e.g. transistors) and passive (e.g. capacitors and resistors) components. By employing the proposed method, the bending variations for transistor current, capacitance and resistance have been reduced by 12.6×, 10.7× and 7.7× respectively (at a bending radius of 1 cm).

To further verify the efficacy of the proposed method, several fundamental digital and analogue circuits were printed and measured, including inverters, ring oscillators and operational amplifiers. The results presented below show that by employing the proposed self-compensation method, the variation in each of these circuits due to bending is significantly reduced.

Experimental Results—Inverters

Two commonly used inverter architectures have also been investigated and they are the diode-connected load and the zero-$V_{GS}$-connected load. Both architectures have their advantages and drawbacks. The former features higher operation speed whilst the latter features higher noise margin.

Figure 5B:
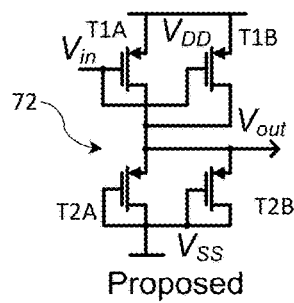
FIG. 5(b) shows a circuit diagram for a proposed split diode-connector inverter.

A conventional diode-connected inverter 70 is shown in FIG. 5(a) while FIG. 5(b) shows a proposed diode-connected inverter 72 employing the self-compensation method according to an embodiments of the invention.

In FIG. 5(a) a first transistor T1 has an input gate voltage $V_{in}$, and output drain voltage $V_{out}$ and a source voltage $V_{DD}$. A second transistor T2 has a drain voltage $V_{SS}$ which is also connected to an input gate for T2 and $V_{out}$ is connected to the source of T2.

In FIG. 5(b), the structure is similar to that of FIG. 5(a) but wherein each transistor T1 and T2 is split into two half transistors T1A/T1B and T2A/T2B, respectively, and each half is printed on an opposite side of the flexible substrate. For ease of illustration the components that are shaded are printed on opposite sides to the components that are unshaded. Accordingly, T1A is printed on one side of the substrate and T1B is printed on the opposite side of the substrate. Vias connect each of the gate, source and drain from T1A to T1B. Similarly, T2A is printed on one side of the substrate and T2B is printed on the opposite side of the substrate. Vias connect each of the gate, source and drain from T2A to T2B. Note that although the schematics appear more complex, the layouts of the conventional inventor 70 and the proposed inventor 72 effectively occupy largely the same area and the complexity remains the same.

Figure 5C:
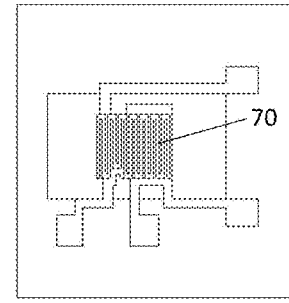
FIG. 5(c) shows a micrograph of the proposed split diode-connector inverter of FIG. 5(b)

FIG. 5(c) depicts a micrograph of the conventional inverter 70. However, it will be understood that a micrograph for the proposed inventor 72 would be largely similar except that the halves of each transistor would be located on either side of the flexible substrate.

FIGS. 6(a) and 6(b) respectively depict the input output transfer characteristics and gain of the conventional diode-connected inverter 70 both flat and when bent at a radius of 1 cm and 2 cm. It is shown that the inverter threshold voltage increases when the conventional inverter 70 is bent concavely and it decreases when bent convexly. Specifically, if the conventional inverter 70 is bent at radius of 1 cm and 2 cm, the inverter threshold voltage has 0.99V variation (0.38V increase when bent concavely and 0.61V decrease when bent convexly) and 0.52V shift variation (0.31V increase when bent concavely and 0.21V decrease when bent convexly) respectively. Similarly, both the transfer characteristics and the inverter gain curve shift to the right when bent concavely and shift to the left when bent convexly. Nevertheless, large variation or shift of the inverter threshold voltage and the transfer characteristic (and the ensuing inverter gain curve) is not desired, as it may lead to deterioration of the noise margin (e.g. negative noise margin) and the ensuing failure of the operation and signal propagation. The maximum gain obtained decreases slightly when the conventional inverter 70 is bent concavely and increases slightly when bent convexly—specifically 2.4% and 1.9% gain reduction respectively for concave bending radius of 1 cm and 2 cm and 4.3% and 1.4% gain increase respectively for convex bending radius of 1 cm and 2 cm. A possible cause for the gain variation is the different bending effects (e.g. disproportional on-resistance change) for drive and load transistors due to their different biasing conditions.

For comparison, FIGS. 6(c) and 6(d) depict the input output transfer characteristics and gain of the proposed diode-connected inverter 72 in accordance with an embodiment of the invention both when flat and when bent at a radius of 1 cm and 2 cm. The inverter threshold voltage varies by increasing only by 0.09V and 0.04V when bent at radius of 1 cm and 2 cm respectively—11× and 13× smaller than that of the conventional design. Furthermore, the proposed inventor 72 results in a relatively smaller gain reduction of 1.4% and 0.9% at a bending radius of 1 cm and 2 cm respectively. Accordingly, it has been shown that the proposed diode-connected inverter 72 is much less sensitive to bending variations than the conventional diode-connected inverter 70.

FIGS. 7(a) and (b) respectively depict the schematics of a zero-$V_{GS}$ connected load inverter based on a conventional design 80 and a proposed design 82 in accordance with an embodiment of the invention.

In FIG. 7(a) a first transistor T1 has an input gate voltage $V_{in}$, a source voltage $V_{DD}$ and an output drain voltage connected to the source of a second transistor T2. The second transistor T2 also has a drain voltage $V_{SS}$ and a gate voltage $V_{out}$.

In FIG. 7(b), the structure is similar to that of FIG. 7(a) but wherein each transistor T1 and T2 is split into two half transistors T1A/T1 B and T2A/T2B, respectively, and each half is printed on an opposite side of the flexible substrate. For ease of illustration the components that are shaded are printed on opposite sides to the components that are unshaded. Accordingly, T1A is printed on one side of the substrate and T1B is printed on the opposite side of the substrate. Vias connect each of the gate, source and drain from T1A to T1B. Similarly, T2A is printed on one side of the substrate and T2B is printed on the opposite side of the substrate. Vias connect each of the gate, source and drain from T2A to T2B.

FIG. 7(c) depicts a micrograph of the conventional zero-$V_{GS}$ connected load inverter 80. However, it will be understood that a micrograph for the proposed zero-$V_{GS}$ connected load inverter 82 would be largely similar except that the halves of each transistor would be located on either side of the flexible substrate.

The transfer characteristics and gain of the conventional zero-$V_{GS}$ connected inverter 80 are depicted in FIGS. 8(a) and 8(b). The inverter threshold voltage has 2.17V variation (1.19V increase when bent convexly and 0.98V decrease when bent concavely) and 1.15V variation (0.59 increase when bent convexly and 0.56V decrease when bent concavely) respectively for bending radius of 1 cm and 2 cm when compared to flat operation. The maximum gain obtained decreased (by 14.3% and 10.1% respectively for 1 cm and 2 cm) when the inverter was bent concavely and increased (14.3% and 11.8% respectively for 1 cm and 2 cm) when bent convexly. These results are converse to the bending results for the diode-connected inverter of FIGS. 5(a) and 6(b). A possible cause is thought to be the significant bending effects due to the zero-$V_{GS}$ connected load transistor operating close to a subthreshold region.

For comparison, FIGS. 8(c) and 8(d) depict the transfer characteristics and measured gain of the proposed zero-$V_{GS}$ connected inverter 82 according to the self-compensation method in an embodiment of the invention. In this example, the transfer characteristics and inverter gain varies only 0.57V and 0.27V when bent at 1 cm and 2 cm respectively—4.3× and 3.8× smaller than that of the conventional design.

Furthermore, the proposed zero-$V_{GS}$ connected inverter 82 results in a relatively smaller gain reduction of 10.1% and 6.7% at a bending radius of 1 cm and 2 cm respectively.

There are two major differences between the bending characteristics of the diode-connected inventors and the zero-$V_{GS}$ connected inverters. First, the direction of threshold voltage variations is opposite. This may be attributed to the different connections of the load transistors. Second, the gain variations of the zero-$V_{GS}$ connected inverter have the same direction but are substantially more severe than for the diode-connected inverter (e.g., for r=1 cm and 2 cm, respectively 28.6% and 21.9% vs 6.7% and 2.3%). This may be attributed to the relatively more severe effects from bending for the on-resistance of the zero-$V_{GS}$ connected load transistor which operates closer to a subthreshold region. For printed electronic (PE) circuit design, in light of the variations observed due to bending, circuits embodying diode-connected inverters are preferred over zero-$V_{GS}$ connected inverters. Interestingly, concave bending results in higher speed for both inverters, and is hence is preferred over convex bending.

Experimental Results—Ring-Oscillators

The output characteristics of ring-oscillators were also studied with respect to bending. As with the inverters, ring-oscillators may comprise diode-connected loads as per FIG. 9 or zero-$V_{GS}$ connected loads as per FIG. 10. The former architecture features a relatively higher oscillating frequency and the latter features a higher reliability with respect to process variations.

The schematics of a diode-connected ring-oscillator are depicted in FIG. 9(a) for a conventional design 90 and in FIG. 9(b) for a proposed design 92 in accordance with an embodiment of the invention where each transistor is split into two halves, one of which is placed on the top of the flexible substrate while the other is placed on the bottom.

In FIG. 9(a) the conventional diode-connected ring-oscillator 90 comprises twelve transistors T1 to T12. T1 has an input $V_{DD}$, a biased source $V_{bias}$ and a drain connected to the source of T2 and the input of T3. T2 has an input connected to the output of T11 and T12 and a drain connected to $V_{SS}$. T3 has source connected to $V_{DD}$ and a drain connected to the source of T4 and the input of T6. T4 has an input and a drain connected to $V_{SS}$. T5 has an input $V_{DD}$, a biased source $V_{bias}$ and a drain connected to the source of T6 and the input of T7. T6 has an input connected to the output of T3 and T4 and a drain connected to $V_{SS}$. T7 has source connected to $V_{DD}$ and a drain connected to the source of T8 and the input of T10. T8 has an input and a drain connected to $V_{SS}$. T9 has an input $V_{DD}$, a biased source $V_{bias}$ and a drain connected to the source of T10 and the input of T11. T10 has an input connected to the output of T7 and T8 and a drain connected to $V_{SS}$. T11 has source connected to $V_{DD}$ and a drain connected to the source of T12 and the input of T2. T12 has an input and a drain connected to $V_{SS}$.

In FIG. 9(b), the structure is similar to that of FIG. 9(a) but wherein each transistor T1 to T12 is split into two half transistors denoted A and B, respectively, and each half is printed on an opposite side of the flexible substrate to form the proposed diode-connected ring-oscillator 92. For ease of illustration the components that are shaded are printed on opposite sides to the components that are unshaded. Accordingly, each A transistor portion is printed on one side of the substrate and each B transistor portion is printed on the opposite side of the substrate. Vias connect each of the gate, source and drain for each A and B portions.

FIGS. 10(a) and (b) show micrographic mirror images of opposite sides of a flexible substrate on which is printed the proposed diode-connected ring-oscillator 92 in accordance with an embodiment of the invention. FIG. 10(c) shows the flexible substrate of FIGS. 10(a) and (b) when bent and clearly shows printed electronic components on both sides of the flexible substrate.

Figure 11:
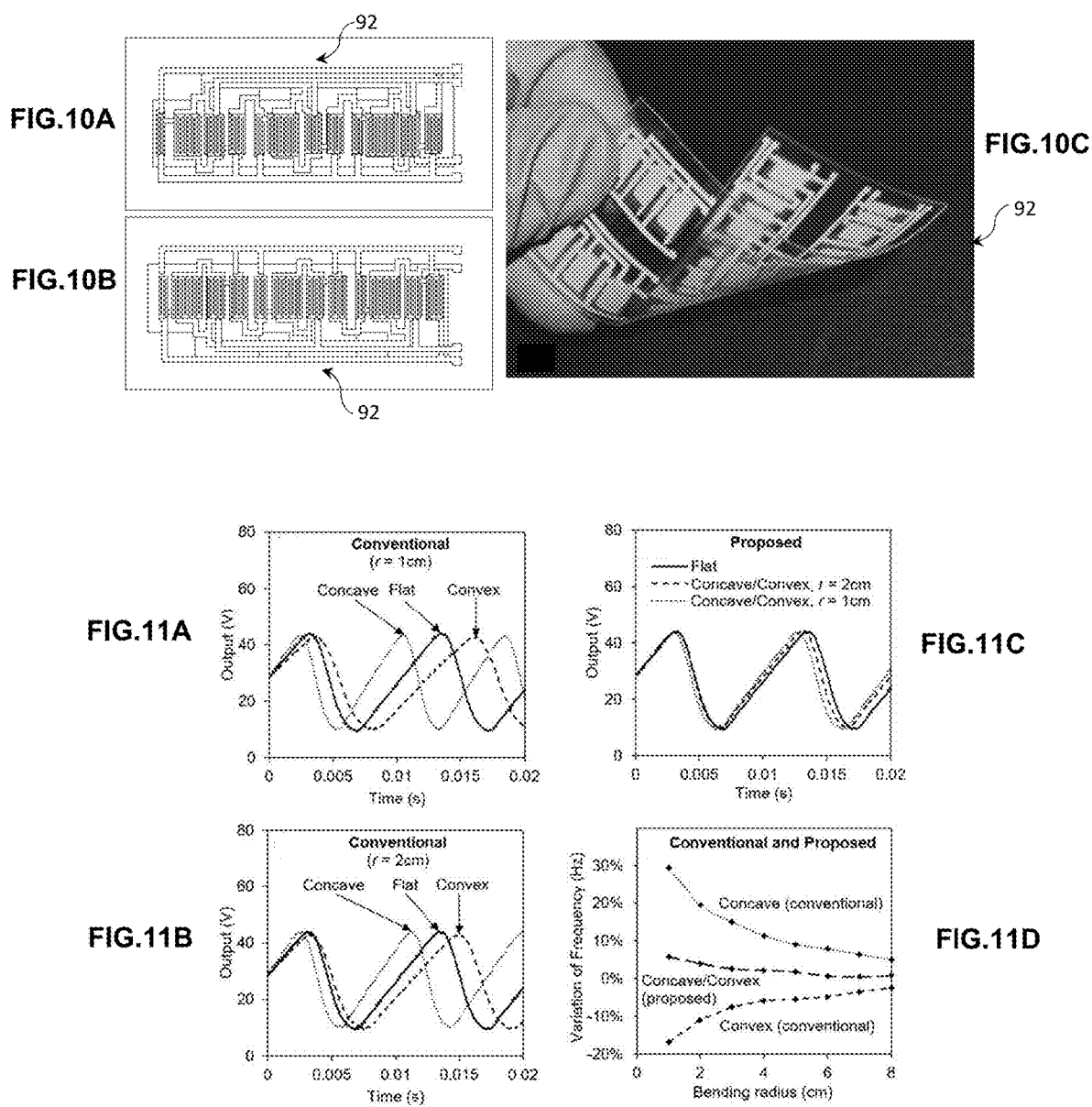
FIG. 11(a) shows a graph of output voltage against time for the conventional diode-connected ring-oscillator of FIG. 9(a) at a bending radius of 1 cm.
FIG. 11(b) shows a graph of output voltage against time for the conventional diode-connected ring-oscillator of FIG. 9(a) at a bending radius of 2 cm.
FIG. 11(c) shows a graph of output voltage against time for the proposed split diode-connected ring-oscillator of FIG. 9(b)
FIG. 11(d) shows a graph of output frequency against bending radius for the proposed split diode-connected ring-oscillator of FIG. 9(b) and the conventional diode-connected ring-oscillator of FIG. 9(a)

FIGS. 11(a) and 11(b) show measured output voltage of the conventional diode-connected ring-oscillator 90, respectively, for a concave and convex bending radius of 1 cm and 2 cm when compared to a flat configuration. The output frequency is 96.4 Hz when the conventional diode-connected ring-oscillator 90 is unbent/flat, and it increases to 124.7 Hz (or 115.1 Hz) when bent concavely and decreases to 80.2 Hz (or 85.9 Hz) when bent convexly at a bending radius of 1 cm (or 2 cm). This represents a frequency variation of 46.2% at 1 cm bending radius and 30.3% at 2 cm bending radius. Bending also leads to a small output swing decrease of 3.2% (or 2.2%) when bent concavely and 5.6% (or 3.7%) decease when bent convexly at 1 cm (or 2 cm).

FIG. 11(c) depicts the output voltage of the proposed diode-connected ring-oscillator 92 according to an embodiment of the invention. The measured output frequency in this case is 102.0 Hz and 100.3 Hz when bent at 1 cm and 2 cm respectively, representing 5.8% and 4.0% frequency decreases—8.0× and 7.6× reduction compared to the conventional design 90.

The output frequency variations at different bending radii (from 1 cm to 8 cm) are summarized in FIG. 11(d). With the conventional design 90, the frequency increases when bent concavely, and vice versa. Additionally, the frequency variation deteriorates quickly when the bending radius is smaller than 4 cm. The changing trend is expected and complies with the current variation trend of bending transistors, as noted earlier. Specifically, frequency variations are 46.2%, 30.3%, 22.4%, 17.2%, 14.3%, 12.6%, 9.9% and 7.4% for bending radii of 1 cm to 8 cm respectively. However with the proposed design 92 using the self-compensation method of embodiments of the invention, the frequency variation has been significantly reduced for each bending radius. Specifically, the resulting variations are 5.8%, 4.0%, 2.5%, 2.1%, 1.7%, 0.6%, 0.4% and 0.7% at bending radii of 1 cm to 8 cm respectively (i.e. 8.0×, 7.6×, 8.8×, 7.9×, 8.6×, 20.3×, 23.2× and 11.4× less than the conventional design 90).

Figure 12A:
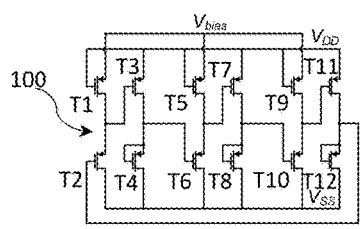
FIG. 12(a) shows a circuit diagram for a conventional zero-$V_{GS}$ connected ring-oscillator.
Figure 12B:
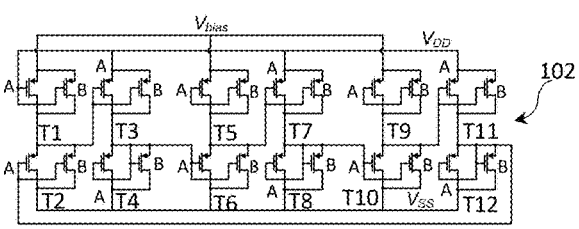
FIG. 12(b) shows a circuit diagram for a proposed split zero-$V_{GS}$ connected ring-oscillator.
Figure 12C:
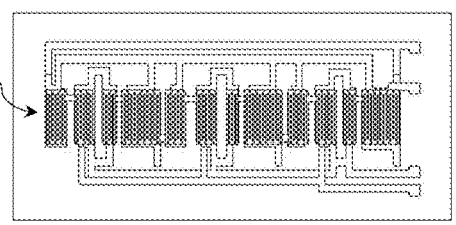
FIG. 12(c) shows a micrograph of the proposed split zero-$V_{GS}$ connected ring-oscillator of FIG. 12(b)

The schematics of a zero-$V_{GS}$ connected ring-oscillator are depicted in FIG. 12(a) for a conventional design 100 and in FIG. 12(b) for a proposed design 102 in accordance with an embodiment of the invention. FIG. 12(c) shows a micrograph of a printed zero-$V_{GS}$ connected ring-oscillator in accordance with the conventional design 100 and which is also equivalent to one half of the proposed zero-$V_{GS}$ connected ring-oscillator 102.

In FIG. 12(a) the conventional zero-$V_{GS}$ connected ring-oscillator 100 comprises twelve transistors T1 to T12. T1 has an input $V_{DD}$, a biased source $V_{bias}$ and a drain connected to the source of T2 and the input of T3. T2 has an input connected to the output of T11 and T12 and a drain connected to $V_{SS}$. T3 has source connected to $V_{DD}$ and a drain connected to the source of T4 and the input of T6. T4 has an input connected to the drain of T3 and a drain connected to $V_{SS}$. T5 has an input $V_{DD}$, a biased source $V_{bias}$ and a drain connected to the source of T6 and the input of T7. T6 has an input connected to the output of T3 and T4 and a drain connected to $V_{SS}$. T7 has source connected to $V_{DD}$ and a drain connected to the source of T8 and the input of T10. T8 has an input connected to the drain of T7 and a drain connected to $V_{SS}$. T9 has an input $V_{DD}$, a biased source $V_{bias}$ and a drain connected to the source of T10 and the input of T11. T10 has an input connected to the output of T7 and T8 and a drain connected to $V_{SS}$. T11 has source connected to $V_{DD}$ and a drain connected to the source of T12 and the input of T2. T12 has an input connected to the source of T11 and a drain connected to $V_{SS}$.

In FIG. 12(b), the structure is similar to that of FIG. 12(a) but wherein each transistor T1 to T12 is split into two half transistors denoted A and B, respectively, and each half is printed on an opposite side of the flexible substrate to form the proposed zero-$V_{GS}$ connected ring-oscillator 102. For ease of illustration the components that are shaded are printed on opposite sides to the components that are unshaded. Accordingly, each A transistor portion is printed on one side of the substrate and each B transistor portion is printed on the opposite side of the substrate. Vias connect each of the gate, source and drain for each A and B portions.

Figure 13A:
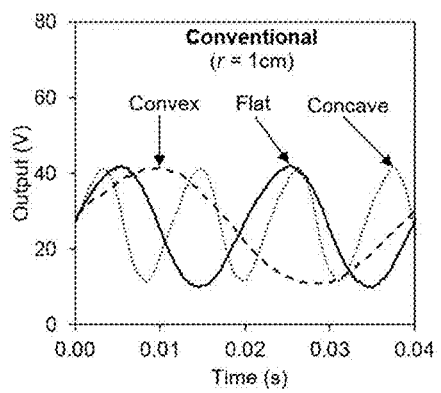
FIG. 13(a) shows a graph of output voltage against time for the conventional zero-$V_{GS}$ connected ring-oscillator of FIG. 12(a) at a bending radius of 1 cm.
Figure 13C:
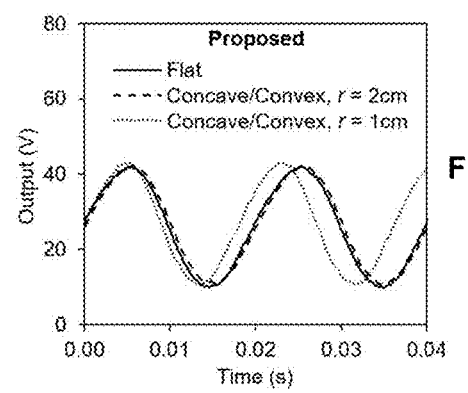
FIG. 13(c) shows a graph of output voltage against time for the proposed split zero-$V_{GS}$ connected ring-oscillator of FIG. 12(b)
Figure 13B:
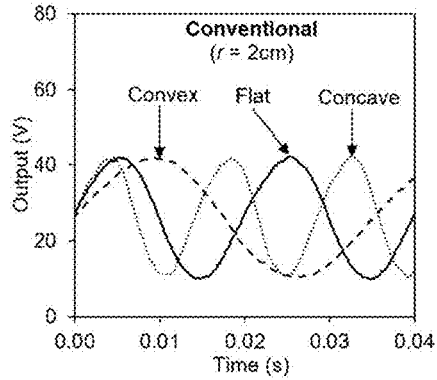
FIG. 13(b) shows a graph of output voltage against time for the conventional zero-$V_{GS}$ connected ring-oscillator of FIG. 12(a) at a bending radius of 2 cm.

The output voltage of the conventional zero-$V_{GS}$ connected ring-oscillator 100 is depicted in FIGS. 13(a) and 13(b) for both concave and convex bending at a bending radius of 11 cm and 2 cm, respectively. The output frequency is 49.7 Hz when the conventional zero-$V_{GS}$ connected ring-oscillator 100 is unbent/flat, and it increases to 87.6 Hz (or 71.4 Hz) and decreases to 25.5 Hz (or 28.4 Hz) at a bending radius of 1 cm (or 2 cm)—representing a frequency variation of 124.9% (or 86.6%). Compared to the conventional diode-connected ring-oscillator 90, the frequency variation of the conventional zero-$V_{GS}$ connected ring-oscillator 100 is relatively larger. A possible cause is the larger load resistance changes of the zero-$V_{GS}$ connected load, which stem from the current variation of the load transistors operating near a sub-threshold region. Bending also leads to a slight output swing decrease of 5.0% (or 1.0%) when bent concavely and 3.4% (or 2.1%) when bent convexly at 1 cm (or 2 cm), which is similarly observed for the conventional diode-connected ring-oscillator 90.

For comparison, FIG. 13(c) depicts the output voltage of the proposed zero-$V_{GS}$ connected ring-oscillator 102 according to an embodiment of the invention. The output frequency changes to 55.1 Hz and 50.3 Hz when bent at 1 cm and 2 cm respectively—representing 10.9% and 1.3% frequency variations. Thus with the proposed design 102, the output frequency variation has been reduced respectively 11.5× and 66.6× at bending radii of 1 cm and 2 cm.

Figure 13D:
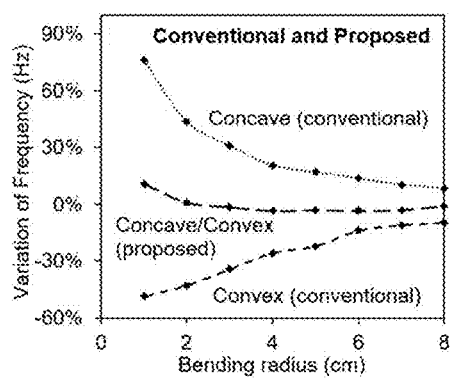
FIG. 13(d) shows a graph of output frequency against bending radius for the proposed split zero-$V_{GS}$ connected ring-oscillator of FIG. 12(b) and the conventional zero-$V_{GS}$ connected ring-oscillator of FIG. 12(a)

The output frequency variations at different the bending radii (from 1 cm to 8 cm) are summarized in FIG. 13(d) for both the conventional design 100 and the proposed design 102. It is therefore shown that the output frequency increases when the conventional zero-$V_{GS}$ connected ring-oscillator 100 is bent concavely, and vice versa. The output frequency variation also deteriorates quickly when the bending radius is smaller than 4 cm—specifically, the variation is 124.9%, 86.6%, 65.1%, 46.2%, 38.9%, 27.5%, 21.2% and 18.0% for bending radius of 1 cm to 8 cm respectively. Compared to the conventional design 100, proposed zero-$V_{GS}$ connected ring-oscillator 102 according to an embodiment of the invention effectively reduce the frequency variations— 11.5×, 68.3×, 461.9×, 12.8×, 12.1×, 7.6×, 6.6× and 13.6× smaller (variations of 10.9%, 1.3%, 0.1%, 3.6%, 3.2%, 3.6%, 3.2% and 1.3%) for bending radii of 1 cm to 8 cm respectively.

Of the two ring oscillator configurations (diode-connected and zero-$V_{GS}$ connected), the variations of the conventional zero-VGS connected ring oscillator 100 are substantially more severe. This may be attributed to the relatively larger drain current variations and ensuing larger on-resistance variations of the zero-VGS connected load transistor which operates near a sub-threshold region. In respect of variations due to bending, similar to the inverters above, the diode-connected topology is preferred over the zero-$V_{GS}$ connected topology for ring oscillators. From a circuit perspective, placing both the diode connected and zero-$V_{GS}$ connected ring oscillators such that they are bent concavely is preferred over convex bending, as this leads to increased speed.

Experimental Results—Differential Amplifiers

The bending properties of a fundamental analogue circuit in the form of a differential amplifier (or op-amp) are now explored. FIG. 14(a) shows a circuit diagram for a conventional differential amplifier 110 while FIG. 14(b) shows a proposed differential amplifier 112 in accordance with an embodiment of the invention. FIG. 14(c) shows a micrograph of a printed differential amplifier in accordance with the conventional design 110 and which is also equivalent to one half of the proposed differential amplifier 112.

In FIG. 14(a) the conventional differential amplifier 110 comprises five transistors T1 to T12. T1 has a gate input $V_{bias}$, a source input $V_{DD}$, and a drain connected to the source of T2 and the source of T3. T2 has a gate input $V_{in\_n}$ and an output $V_{out\_p}$. T3 a gate input $V_{in\_p}$ and an output $V_{out\_n}$. T4 has $V_{out\_p}$ as a source input and $V_{SS}$ connected to the drain and gate. T5 has $V_{out\_n}$ as a source input and $V_{SS}$ connected to the drain and gate.

In FIG. 14(b), the structure is similar to that of FIG. 14(a) but wherein each transistor T1 to T12 is split into two half transistors denoted A and B, respectively, and each half is printed on an opposite side of the flexible substrate to form the proposed differential amplifier 112. For ease of illustration the components that are shaded are printed on opposite sides to the components that are unshaded. Accordingly, each A transistor portion is printed on one side of the substrate and each B transistor portion is printed on the opposite side of the substrate. Vias connect each of the gate, source and drain for each A and B portions.

FIG. 15(a) shows measured frequency responses of the conventional differential amplifier 110 when flat and when bent convexly and concavely for a bending radius of 1 cm and 2 cm, respectively. The measured gain is 5.34 dB and unit-gain bandwidth is 289.0 Hz for the flat (unbent) condition. The gain decreases slightly to 4.88 dB (or 5.05 dB) and 4.76 dB (or 4.87 dB) when the differential amplifier is bent concavely and convexly at radius of 1 cm (or 2 cm) respectively. Also the unit-gain bandwidth is significantly affected by the bending. It increases to 386.0 Hz (or 352.4 Hz) and decreases to 202.3 Hz (or 245.4 Hz) when bent concavely and bent convexly at 1 cm (or 2 cm) respectively—representing 63.6% (or 37.0%) unit-gain bandwidth variations at bending radii of 1 cm (or 2 cm).

FIG. 15(b) shows the measured frequency response of the proposed differential amplifier 112 according to an embodiment of the invention. As can be seen, the unit-gain bandwidth variation is substantially reduced and only increases to 320.0 Hz (or 307.8) for bending radii of 1 cm (or 2 cm), which is equivalent to a 10.7% (or 6.5%) variation and is 5.9× (or 5.7×) smaller than that of the conventional differential amplifier 110. Furthermore, gain reduction is also alleviated to some extent, with gain decreases to 4.92 dB (or 5.13 dB) when bent at a radii of 1 cm (or 2 cm).

From a circuit perspective, because printed electronic (PE) differential amplifiers are expected to operate in an open-loop (vis-a-vis a closed-loop) configuration, the variations of gain (and unity-gain bandwidth variations) need to be low and the proposed design 112 can help to achieve this. Also, from FIG. 15(a), the unity-gain bandwidth conversely, perhaps somewhat unexpectedly, increases positively and negatively for concave and convex bending respectively. Therefore, a placement such that the bending is concave would be preferred over convex bending.

Figures 16A, 16B:
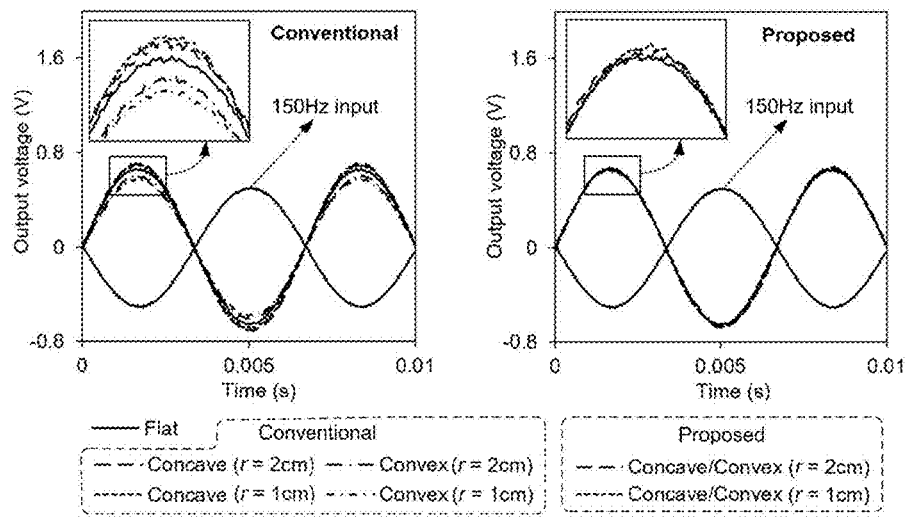
FIG. 16(a) shows a graph of output voltage (V) against time (s) for the conventional operational-amplifier of FIG. 14(a)
FIG. 16(b) shows a graph of output voltage (V) against time (s) for the proposed split operational-amplifier of FIG. 14(b)

The reduction in performance variations using embodiments of the invention can also be observed from the time domain input-output waveform in FIGS. 16(a) and (b) for an input-output frequency of 150 Hz. As shown in FIG. 16(a) for the conventional differential amplifier 110, with a sine wave input of 1V, the output amplitude obtained is 1.31V for a flat (unbent) condition, and changes to 1.41V (or 1.38V) and 1.14V (or 1.20V) when the conventional differential amplifier 110 is bent concavely and bent convexly at a bending radius of 1 cm (or 2 cm)—representing 18% (or 13.6%) amplitude variations. In contrast, as shown in FIG. 16(b), for the proposed differential amplifier 112 according to an embodiment of the invention, the output amplitude changes to 1.33V (or 1.32V) when bent at a bending radius of 1 cm (or 2 cm), representing only a 2.1% (or 1.1%) variation which is 8.6× (or 12.4×) smaller than that of the conventional design 110.

Circuit Splitting

Figures 17A, 17B:
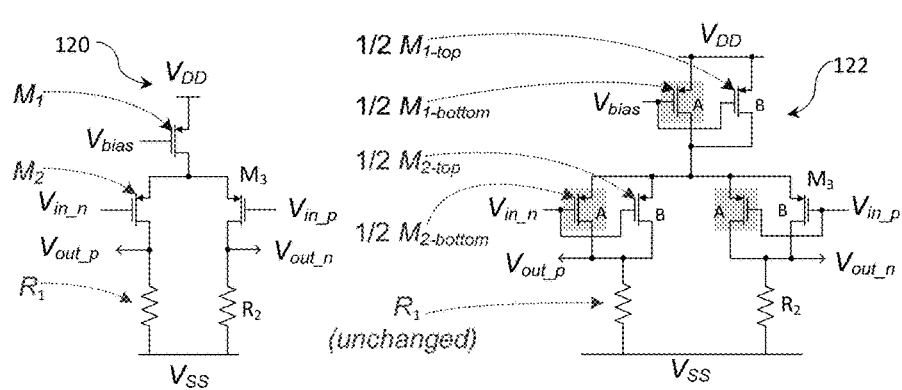
FIG. 17(a) shows a convention design of an amplifier comprising transistors that are sensitive to bending and resistors that are insensitive to bending.
FIG. 17(b) shows a proposed design according to an embodiment of the invention in which only the components that are sensitive to bending are printed on each side of a substrate.

FIG. 17(a) shows a circuit diagram of a conventional amplifier 120 comprising three transistors $M_1$, $M_2$ and $M_3$ and two resistors $R_1$ and $R_2$. In this case, each transistor is sensitive to bending effects but each resistor is not. Accordingly, only the bending-sensitive transistor components are split into two halves A and B to form a proposed amplifier 122 in accordance with an embodiment of the invention, as shown in FIG. 17(b). Hence, to compensate for the characteristic variation of the conventional amplifier 120 due to bending, only the transistors $M_1$, $M_2$ and $M_3$ need to be separated into two halves whilst the resistors $R_1$ and $R_2$ remain unchanged.

More specifically, $M_1$ has a source input $V_{DD}$, a gate input $V_{bias}$ and a drain connected to a source of $M_2$ and a source of $M_3$. $M_2$ has a gate input $V_{in\_n}$ and a drain connected to $V_{out\_p}$ and $R_1$. $M_3$ has a gate input $V_{in\_p}$ and a drain connected to $V_{out\_n}$ and $R_2$. Both $R_1$ and $R_2$ are connected to $V_{SS}$.

In FIG. 17(b), the structure is similar to that of FIG. 17(a) but wherein each transistor $M_1$, $M_2$ and $M_3$ is split into two half transistors denoted A and B, respectively, and each half is printed on an opposite side of the flexible substrate to form the proposed amplifier 122. For ease of illustration the components that are shaded are printed on opposite sides to the components that are unshaded. Accordingly, each A transistor portion is printed on one side of the substrate and each B transistor portion is printed on the opposite side of the substrate. Vias connect each of the gate, source and drain for each A and B portions.

Component Configurations

Figure 18:
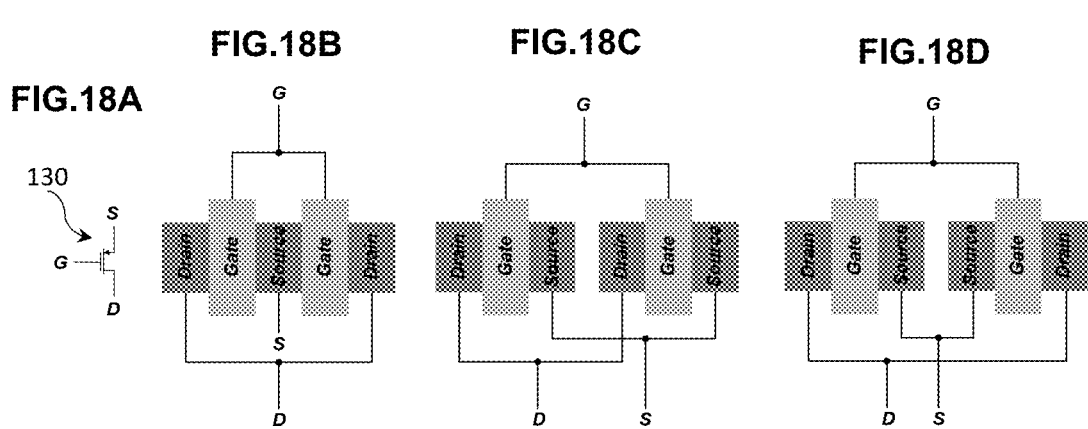
FIG. 18(a) shows a circuit diagram for a transistor.
FIGS. 18(b), 18(c) and 18(d) show three different layout configurations for the same transistor.

FIG. 18(a) shows a circuit diagram of a transistor 130 comprising a gate G, source S and drain D. FIGS. 18(b), (c) and (d) show three different layouts for the transistor 130.

More specifically, FIG. 18(b) shows a layout wherein the gate G and drain D are split into two halves but a common source S is provided there-between. FIG. 18(c) shows a layout wherein each of the gate G, drain D and source S is split into two separate halves, each half being printed with the same layout. FIG. 18(d) shows a layout wherein each of the gate G, drain D and source S is split into two separate halves, similar to FIG. 18(c), however, in this case each half is printed as a mirror image of the other such that each source S is adjacent.

Although, in general, to ensure good compensation for bending, the two portions (or halves) of the bending-sensitive components should be separated equally it is not necessary for each portion/half to be identical. Accordingly, for a transistor any of the three layouts of FIGS. 18(b), (c) and (d) could be employed separately for each half of a split transistor in an embodiment of the invention. For example, a top half transistor may employ layout 18(b) and a bottom half transistor may employ either layout (c) or (d).

However, in order for the bending compensation to be commensurate, each portion/half of a bending-sensitive component should be functionally equivalent to provide a roughly equal and opposite variation on bending. In practice, this means that for a transistor, the two halves should have the same aspect ratio (i.e. the same width to length ratio). For the case of passive components (resistors, capacitors and inductors), the two halves should have the same values (i.e. the same resistance, capacitance and inductance respectively). However, in each case the layout of the two halves of the bending-sensitive component may be different (i.e. configured differently).

Applications

Figure 19:
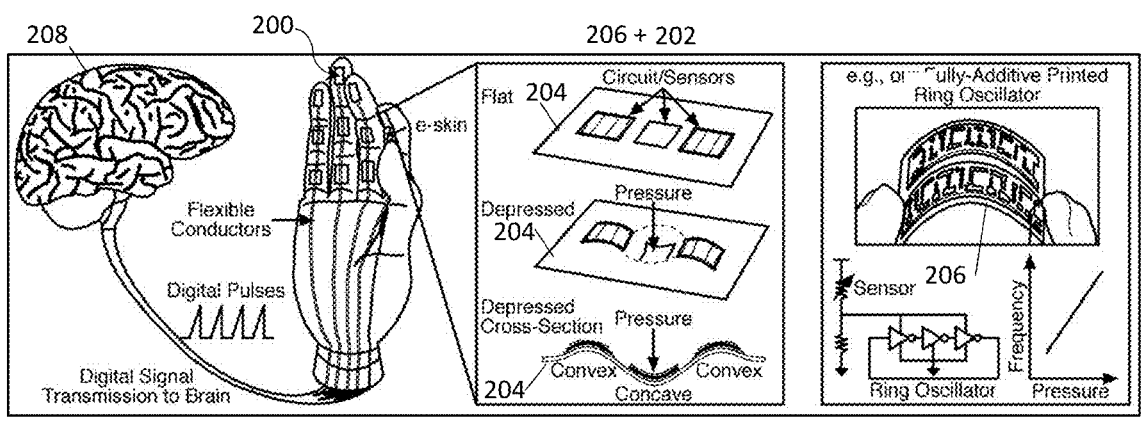
FIG. 19 shows an artificial tactile e-skin sensing system, comprising a flexible sensor layer and a proposed Fully-Additive printed circuit layer in accordance with an embodiment of the invention.

FIG. 19 shows one possible application for embodiments of the invention. In this example, the application relates to a neuroprosthetic e-skin 200 which is configured to mimic the pressure sensitivity of human skin. The e-skin comprises tactile sensors 202 on a flexible substrate 204 for sensing pressure and/or bending and an electrical circuit assembly 206 in accordance with an embodiment of the invention, for signal conditioning or processing (e.g. to convert a sensed analogue parameter into a digital signal that mimics a physiological stimulation). Each flexible substrate 204 is connected via flexible conductors to a user's brain 208 such that digital pulses corresponding to a sensed condition are transmitted to the user.

In this e-skin 200 example, when the flexible substrate 204 is bent as part of pressure sensing, the flexible substrate 204 at the point of contact bends inwardly (i.e. concavely) while the adjacent areas bend outwardly (i.e. convexly).

To depict the severity of the intractable changes due to bending, the el electrical circuit assembly 206 may comprise a ring oscillator according to an embodiment of the invention such as that of FIG. 9(b) or 12(b), which represents a mechanical-electronic transduction circuit of the e-skin 200. Accordingly, from the above experimental results it has been shown that an output frequency of the proposed ring oscillator 206 can reduce the variation of a conventional ring oscillator by 8 times for a diode-connected ring-oscillator and by 12 times for a zero-VGS connected ring oscillator at 1 cm bending.

CONCLUSION

In summary, the applicants have shown that the proposed self-compensation method of embodiments of the invention provides very significant variation reduction (up to over two orders of magnitude) due to bending for both printed digital and analogue circuits. A summary of the variations of conventional and proposed circuits, and the resulting variations reduction is tabulated in Table I below.

TABLE 1

Summary of measurements of unbent and bent devices/circuits and reduction of variations arising from the proposed self-compensation method

| Device/Circuits | Parameters | Variations (Conventional) | | Variations (Proposed) | | Variations Reduction | |
|---|---|---|---|---|---|---|---|
| | | r = 1 cm | r = 2 cm | r = 1 cm | r = 2 cm | r = 1 cm | r = 2 cm |
| OTFT | $I_{DS}$ | 63% | 30% | 5.0% | 1.2% | 12× | 26× |
| Capacitor | C | 2.9% | 1.5% | 0.27% | 0.30% | 11× | 5× |
| Resistor | R | 14% | 8.0% | 1.8% | 0.54% | 8× | 15× |
| Diode-Connected Inverter | $V_{th}$ | 0.99 V | 0.52 V | 0.09 V | 0.04 V | 11× | 13× |
| | Gain | 6.7% | 3.3% | 1.4% | 0.90% | 5× | 4× |
| Zero-$V_{GS}$ Connected Inverter | $V_{th}$ | 2.17 V | 1.15 V | 0.57 V | 0.27 V | 4× | 4× |
| | Gain | 28.6% | 21.9% | 10.1% | 6.7% | 3× | 3× |
| Diode-Connected Ring Oscillator | Output Frequency | 46.2% | 30.3% | 5.8% | 4.0% | 8× | 8× |
| Zero-$V_{GS}$ Connected Ring Oscillator | Output Frequency | 124.9% | 86.5% | 10.6% | 0.8% | 12× | 108× |
| Op-amp | Gain at Low Frequency | 0.56 dB | 0.43 dB | 0.32 dB | 0.12 dB | 2× | 4× |
| | Unity-Gain Bandwidth | 63.6% | 37.0% | 10.7% | 6.5% | 6× | 6× |

Embodiments of the invention provide a localized self-compensation means that innately and very effectively self-compensates for the variations of printed electronic circuits and systems due to bending. Notably, the variation in circuit performance is improved without compromising the complexity, area and overall thickness of the device and without hardware overheads or power dissipation.

In terms of the variations observed, capacitor-based circuits and diode-connected circuits are preferred; and for inverters and ring oscillators, concave bending is preferred. In addition, the variation directions of capacitors and resistors are the same, but the converse of transistors. For the inverter and ring-oscillator, the variations range from moderate-to-very-severe and severe-to-extremely-severe respectively for diode-connected and zero-VGS connected topologies. This depicts that diode-connected circuits are preferred; and for speed, concave-bending is preferred. For the differential amplifier, the gain and gain bandwidth variations range from mild-to-severe; and concave and convex bending is respectively preferred for gain-bandwidth and gain.

By leveraging the process-simplicity of the proposed Fully-Additive All-Air Low-Temperature printing-process, a novel localized self-compensation means is achieved involving the partitioning of a given bending-sensitive component into two halves, each placed on the top/bottom of the flexible-substrate surface. The proposed means is highly efficacious with reduction of variations ranging from ~2× to >100×, yet without power, hardware or substrate-area overheads.

Although only certain embodiments of the present invention have been described in detail, many variations are possible in accordance with the appended claims. For example, features described in relation to one embodiment may be incorporated into one or more other embodiments and vice versa.

REFERENCES

The following references are incorporated herein by reference, with regards to the background of the invention.
[1] J. Zhou, T. Ge, and J. Chang, "Fully-Additive Low-Cost PE with Very-Low Process Variations," IEEE Trans Electron Devices, 2015, Accepted for Publication
[2] J. Chang, "Digital PE on Flex Sub: Challenges and Applications," Keynote Address, IEEE Async Circuits and Systems Conference, Germany, 2014
[3] J. Chang, X. Zhang, T. Ge, and J. Zhou, "Fully-Additive PE on flexible substrates: High gain amps and DAC," Organic Electronics, vol. 15, pp. 701-710, 2014.
[4] X. Zhang, T. Ge, and J. Chang, "Fully-Additive PE: Transistor model, process variation and fundamental circuit designs," Organic Electronics, vol. 26, pp. 371-379, 2015.
[5] O. E. Association, "OE-A Roadmap for Organic and Printed Electronics," White Paper 2014.
[6] S. Abdinia et al., "A 4b ADC manufactured in a fully-printed organic complementary tech including resistors," ISSCC, 2013, pp. 106-107.
[7] X. Wei et al., "A 3-V, 6-Bit C-2C DAC Using Complementary OTFTs," IEEE J. Solid-State Circuits, vol. 45, pp. 1380-1388, 2010.
[8] C. Yang et al., "Bending-stress-driven phase transitions in pentacene thin films for flex OTFTs," Applied Physics Letters, vol. 92, p. 243305, 2008.
[9] J. Pu et al., "Highly Flexible MoS2 Thin-Film Transistors with Ion Gel Dielectrics," Nano Letters, vol. 12, pp. 4013-4017, 2012/08/08 2012.
[10] K. Fukuda et al., "Strain sensitivity and durability in p-type and n-type OTFTs with printed silver electrodes," Sci. Rep., vol. 3, 2013.
[11] L. Tong, C. Kwen-Siong, J. S. Chang, and G. Bah-Hwee, "An Ultra-Low Power Asyn-Logic In-Situ Self-Adaptive VDD Sys for Wireless Sensor Networks," IEEE J. Solid-State Circuits, vol. 48, pp. 573-586, 2013.
[12] K. Chong, K. Chang, G. Bah-Hwee, and J. Chang, "Syn-Logic and GALS Acoustic DSP," IEEE J. Solid-State Circuits, vol. 47, pp. 769-780, 2012.
[13] L. Wei-Hsiao et al., "Placement Optimization of Flexible TFT Digital Circuits," IMS3TW, 2011, pp. 149-152.
[14] T. Sekitani, et al., "Ultraflexible OTFTs embedded at a neutral strain position," Applied Physics Letters, vol. 87, pp. 173502-173502-3, 2005.
[15] DuPont Printed Electronic Materials. Available: www2.dupont.com/MCM/en_US/products/printed_electronics.html
[16] W. J. Hyun et al., "High-Resolution Patterning of Graphene by Screen Printing with a Silicon Stencil for Highly Flexible Printed Electronics," Advanced Materials, vol. 27, pp. 109-115, 2015.
[17] P. H. Lau et al., "Fully Printed, High Performance Carbon Nanotube TFTs on Flexible Substrates," Nano Letters, vol. 13, pp. 3864-3869, 2013.
[18] K.-J. Baeg et al., "Low-voltage, high speed inkjet-printed flexible complementary polymer electronic circuits," Organic Electronics, vol. 14, pp. 1407-1418, 2013.
[19] M. Kaltenbrunner et al., "An ultra-lightweight design for imperceptible plastic electronics," Nature, vol. 499, pp. 458-463, 2013.
[20] J. O'Doherty et al., "Active tactile exploration using a brain-machine-brain interface," Nature, vol. 479, pp. 228-231, 2011.
[21] B. Tee et al., "A skin-inspired organic digital mechanoreceptor," Science, vol. 350, pp. 313-316, 2015.
[22] C. Wang et al., "Extremely Bendable, High-Performance Integrated Circuits Using Semiconducting Carbon Nanotube Networks for Digital, Analog, and Radio-Frequency Applications," Nano Letters, vol. 12, pp. 1527-1533, 2012.
[23] T. Sekitani et al., "Flexible organic transistors and circuits with extreme bending stability," Nature Materials, vol. 9, pp. 1015-1022, 2010.
[24] Q. Cao et al., "Medium-scale carbon nanotube thin-film integrated circuits on flexible plastic substrates," Nature, vol. 454, pp. 495-500, 2008.
[25] W. Liu et al., "Placement Optimization of Flexible TFT Digital Circuits," International Mixed-Signals, Sensors, and Systems Test Workshop, 2011, pp. 149-152.
[26] J. S. Chang and T. C. Tong, "A micropower-compatible time-multiplexed SC speech spectrum analyzer design," IEEE Journal of Solid-State Circuits, vol. 28, pp. 40-48, 1993.

The invention claimed is:

1. A method of fabricating an electrical circuit assembly on a flexible substrate comprising:
  a) identifying one or more bending-sensitive elements of an electrical circuit assembly, each bending-sensitive element having a performance that varies when said bending-sensitive element is flexed;
  b) splitting said one or more bending-sensitive elements into a first portion and a second portion, wherein the first portion and the second portion are functionally equivalent and together equate to said bending-sensitive element;
  c) printing the first portion of said bending-sensitive element on a first surface of the flexible substrate;
  d) printing the second portion of said bending-sensitive element on a second surface of the flexible substrate, diametrically opposite the first portion such that bending of the flexible substrate has an opposite effect on each of the first and second portions thereby serving to substantially cancel the effect on each portion out; and
  e) electrically connecting the first portion and the second portion.

2. The method according to claim 1 wherein the first and second portions have identical configurations.

3. The method according to claim 1 wherein the first and second portions have different configurations.

4. The method according to claim 1 wherein the first and second portions have one or more of: a same value, a same dimension, a same area, a same volume, a same footprint or a same aspect ratio.

5. The method according to claim 1 wherein the printing of the first and/or second portions is by a Fully-Additive process.

6. The method according to claim 5 wherein the Fully-Additive process is an all-air process.

7. The method according to claim 5 wherein the Fully-Additive process is a low temperature process.

8. The method according to claim 1 further comprising the following steps for the printing of each of the first and second portions of the electrical circuit assembly, when the electrical circuit assembly comprises an organic thin film transistor (OTFT):
  a) screen printing and curing a gate on the flexible substrate;

b) screen printing and curing a dielectric on the gate;
c) screen printing and curing a drain and a source spatially-separated on the dielectric; and
d) slot die coating a semiconductor layer between the drain and source.

9. An electrical circuit assembly comprising:
a flexible substrate;
a first portion of a bending-sensitive element of the electrical circuit assembly printed on a first surface of the flexible substrate;
a second portion of the bending-sensitive element of the electrical circuit assembly printed on a second surface of the flexible substrate;
wherein the first and second portions are electrically connected to each other and are functionally equivalent; and
wherein the first portion and the second portion are located diametrically opposite each other such that bending of the flexible substrate has an opposite effect on each of the first and second portions thereby serving to substantially cancel the effect on each portion out.

10. The electrical circuit assembly of claim 9 wherein the electrical circuit assembly comprises one or more individual elements, components or circuits.

11. The electrical circuit assembly of claim 9 wherein the electrical circuit assembly comprises one or more of the following: transistor, Organic Thin Film Transistor (OTFT), resistor, capacitor, inductor, inverter, diode-connected inverter, zero-gate-source-voltage (zero-$V_{GS}$) inverter, ring-oscillator, diode-connected ring-oscillator, zero-gate-source-voltage (zero-$V_{GS}$) ring-oscillator, multi-layer interconnect, data converter, digital-to-analogue converter (DAC), operational amplifier (op-amp), differential amplifier, capacitor-based circuit, diode-connected circuit or sensor.

12. The electrical circuit assembly of claim 9 configured for analogue, digital or mixed signal processing.

13. The electrical circuit assembly of claim 9 wherein the first and second portions are electrically connected through one or more vias.

14. A device comprising the electrical circuit assembly of claim 9.

15. The device according to claim 14 configured as an electronic skin.

16. The device according to claim 14 comprising one or more sensors on the flexible substrate for sensing pressure and/or bending and the electrical circuit assembly for signal conditioning or processing.

17. The device according to claim 14 configured as a neuroprosthetic.

* * * * *